(12) United States Patent  (10) Patent No.: US 8,642,720 B2
Onaka et al.  (45) Date of Patent: Feb. 4, 2014

(54) PHOTOELECTRIC CONVERSION ELEMENT, METHOD OF MANUFACTURING PHOTOELECTRIC CONVERSION ELEMENT AND SOLAR CELL

(75) Inventors: Kenichi Onaka, Hachioji (JP); Kazuya Isobe, Hachioji (JP); Kazukumi Nishimura, Hino (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 214 days.

(21) Appl. No.: 13/229,334

(22) Filed: Sep. 9, 2011

(65) Prior Publication Data

US 2012/0060927 A1    Mar. 15, 2012

(30) Foreign Application Priority Data

Sep. 14, 2010  (JP) ................. 2010-205370

(51) Int. Cl.
*C08G 75/06* (2006.01)
*C08G 75/02* (2006.01)
*C08G 75/00* (2006.01)

(52) U.S. Cl.
USPC ........... 528/380; 528/377; 528/378; 528/492; 528/502 R; 429/209

(58) Field of Classification Search
USPC ..................... 528/380, 377, 378, 492, 502 R; 428/424.6, 690; 429/209
See application file for complete search history.

(56) References Cited

FOREIGN PATENT DOCUMENTS

JP    2003-317814 A    11/2003
JP    2009-040903 A    2/2009

OTHER PUBLICATIONS

Brian O'Regan, et al. "A low-cost, high-efficiency solar cell based on dye-sensitized colloidal TiO2 films" Nature, Oct. 24, 1991, vol. 353, p. 737-740, Institute of Physical Chemistry, Swiss Federal Institute of Technology, CH-1015 Lausanne, CH.

(Continued)

Primary Examiner — Duc Truong
(74) Attorney, Agent, or Firm — Lucas & Mercanti, LLP

(57) ABSTRACT

The present invention provides a photoelectric conversion element exhibiting excellent photoelectric conversion efficiency and excellent stability in photoelectric conversion function; a method of manufacturing the photoelectric conversion element; and a solar cell thereof in order to solve the current problems. Disclosed is a photoelectric conversion element possessing a substrate and provided thereon, a first electrode, a photoelectric conversion layer containing a semiconductor and a sensitizing dye, a hole transport layer and a second electrode, wherein the hole transport layer possesses a polymer having a repeating unit represented by Formula (1) or Formula (2):

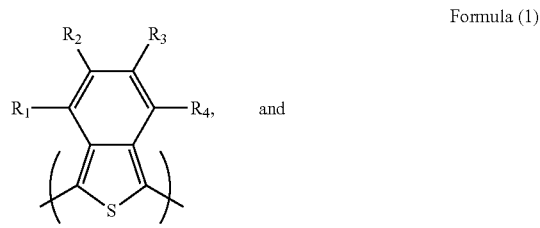

Formula (1)

and

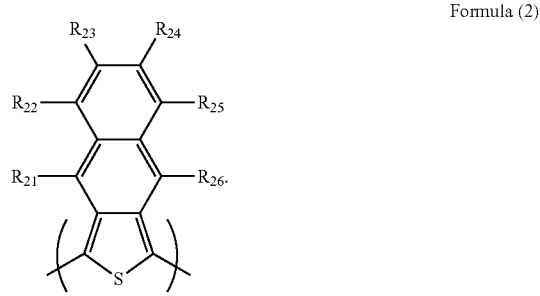

Formula (2)

8 Claims, 1 Drawing Sheet

(56) References Cited

OTHER PUBLICATIONS

Xia, et al. "Influence of Doped Anions on Poly (3,4-ethylenedioxythiophene) as Hole Conductors for Iodine-Free Solid-State Dye-Sensitized Solar Cells", JACS Articles, Journal of the American Chemical Society, 2008, p. 1258-1263, vol. 130, No. 4.

C.W. Tang, et al. "Two-layer organic photovoltaic cell" Applied Physics Letters, 1985, p. 183-185, vol. 48.

U. Bach, et al. "Solid-state dye-sensitized mesoporous TiO2 solar cells with high photon-to-electron conversion efficiencies", Nature, Oct. 8, 1998, p. 583-584, vol. 395.

Zhu, et al. "Conducting Polymetallorotaxanes: Metal Ion Mediated Enhancements in Conductivity and Charge Localization" Journal of the American Chemical Society, 1997, p. 12568-12577, vol. 119.

K. Tennakane, et al. "An efficient dye-sensitized photoelectrochemical solar cell made from oxides of tin and zinc" J. Chem Soc. Chem Commun., 1999, p. 15-16.

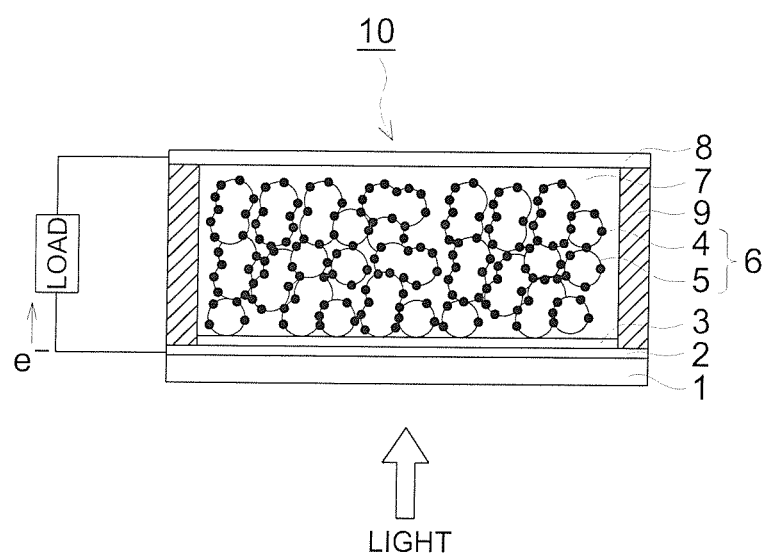

PHOTOELECTRIC CONVERSION ELEMENT, METHOD OF MANUFACTURING PHOTOELECTRIC CONVERSION ELEMENT AND SOLAR CELL

This application claims priority from Japanese Patent Application No. 2010-205370 filed on Sep. 14, 2010, which is incorporated hereinto by reference.

TECHNICAL HELD

The present invention relates to a dye-sensitizing type photoelectric conversion element, a method of manufacturing the photoelectric conversion element, and a solar cell fitted with the photoelectric conversion element.

BACKGROUND

In recent years, attention has been focused on solar energy as an energy source because of environmental problems and so forth.

Methods of converting light or heat of solar energy into electrical energy as usable energy have been practically available.

Among these methods, a method of converting sunlight into electrical energy, for example, is a typical example, and a photoelectric conversion element is utilized in this method.

The photoelectric conversion element in which an inorganic material such as single crystalline silicon, polycrystalline silicon, amorphous silicon, and cadmium telluride, indium copper selenide or the like is employed is widely used as a photoelectric conversion element, and has been utilized for a so-called solar cell.

A solar cell fitted with a photoelectric conversion element in which the inorganic material is used had problems such as complicated manufacturing processes together with a number of processes at high production cost and so forth because of a multilayer p-n junction structure in which a high purity product obtained via a high purification process for silicon used as a material or the like is demanded.

On the other hand, studies of a photoelectric conversion element in which an organic material is used as a simple element have been also in progress.

As described in C. W. Jang: Applied Physics Letters, 48, 1.83 (1986), for example, reported is a p-n junction type organic photoelectric conversion element in which a perylenetetracarboxylic acid derivative as a n-type organic dye and a copper phthalocyanine as a p-type organic dye are joined.

In order to improve a short exciton diffusion length and thin thickness of a space-charge layer taken into account as a drawback, results thereof are being made by largely increasing the area of a p-n junction region where organic thin films are simply layered, and by sufficiently trying to secure the number of organic dyes involved in charge separation.

Further, as described in G. Yu, J. Gao, J. C. Humelen, F. Wudl and A. J. Heeger: Science, 270, 1789 (1996), disclosed is a technique by which the p-n junction region is largely increased by mixing a n-type electron-conductive organic material and a p-type hole-conductive polymer in the film to conduct charge separation in the entire film. Propose was a photoelectric conversion element in which Heeger et al. made a conjugated polymer to be a p-type conductive polymer in 1995 to mix fullerene as an electron-conductive material.

Such a photoelectric conversion element gradually exhibits an improved property thereof, but stable behavior with high conversion efficiency has not been obtained yet.

However, in 1991, Gratzel succeeded in preparation of a photoelectric conversion element having a high conversion efficiency in stable operation by preparing porous titanium oxide, and sufficiently securing the charge separation area (the number of molecules contributed for charge separation) in detailed experiments having been enormously compiled.

In the case of this photoelectric conversion element, repeated are cycles in which a dye adsorbed onto the surface of porous titanium oxide is optically excited and becomes a dye cation via electron-injection from the dye to the titanium oxide, and the dye receives electrons from the counter electrode via a hole transport layer. An electrolytic solution in which an electrolyte containing iodine is dissolved in an organic solvent is used as a hole transport layer.

This photoelectrical conversion element produces excellent reproducibility together with stability of titanium oxide, and in large expansion of an R&D base, and this photoelectric conversion element is also called a dye-sensitizing type solar cell, whereby large expectation and attention have been received.

This technique shows the advantage of being able to use inexpensive semiconductors since inexpensive metallic compound semiconductors such as titanium oxide and so forth are not necessary to be refined up to high purity, and of effectively converting sunlight having a large amount of the visible light component into electricity since usable light extends up to the broad visible light region.

However, since a ruthenium complex exhibiting resource restriction given to a photoelectric conversion layer, an expensive ruthenium complex should be used, and there appears a problem such as insufficient stability produced during aging.

Further, as another problem, since a dye-sensitizing type solar cell is operated with the foregoing electrolyte solution, there further appears another problem such that a mechanism to avoid retention and outflow dissipation of an electrolyte and iodine should be separately provided.

A lead storage battery and a lithium cell are typified as typical examples of other electrochemical elements each possessing an electrolytic solution, but a secondary problem appears to be clearly induced when dissipated chemical species are newly stored in the environment since no 100% of even the compactly modularized electrochemical element has been collected and the compactly modularized electrochemical element has not always been recycled.

An all-solid-state dye-sensitizing type solar cell further taking over the advantage of a dye-sensitizing type solar cell, for which such electrolytic solution problems are avoided, is now in progress.

In this field, those in which amorphous organic hole transfer agents are employed as described on U. Bach, D. Lupo. P. Comte, J. E. Moser, F. Weissortel, J. Salbeck, H. Spreitzer and M. Gratzel, Nature, 395, 583 (1998), and those in which copper iodide is used for a hole transfer agent as described in G. R. A. Kumara, S. Kaneko, M. Kuya, A. Konno and K. Tennakone: Key Engineering Materials, 119, 228 (2002), but since the hole transfer agent exhibits low conductivity, a sufficient photoelectric conversion efficiency has not yet been given.

Further, as a hole transfer agent exhibiting considerably high conductivity, a polythiophene based material is provided as a typical example, and an all-solid-state dye-sensitizing type solar cell in which PEDOT is used as a hole transport agent is reported (refer to Patent Document 1 and Non-patent Document 2, for example).

Further, a photoelectric conversion element in which polyisothianaphthene is used as a hole transport agent has been reported (Patent Document 2). However, since PEDOT exhibits absorption in the visible light range between 400-700 nm, loss is generated with respect to light absorption of a dye, resulting in insufficiency in photoelectric conversion efficiency. Further, polyisothianaphthene disclosed in Patent Document 2 also has not yet been sufficient in photoelectric conversion function stability.

Patent Document 1: Japanese Patent O.P.I. (Open to Public inspection) Publication No. 2003-317814

Patent Document 2 Japanese Patent O.P.I. Publication No. 2009-40903

Non-patent Document 1: B. O'Regan and M. Gratzel: Nature, 353, 737 (1991)

Non-patent Document 2: J. Xia, N. Masaki, M. Lira-Cantu, Y. Kim, K. Jiang and S. Yanagida: Journal of the American Chemical Society, 130, 1258 (2008).

SUMMARY

The present invention was made on the basis of the above-described problems, and it is an object of the present invention to provide an all-solid-state dye-sensitizing type photoelectric conversion element exhibiting excellent photoelectric conversion efficiency and excellent stability in photoelectric conversion function; a method of manufacturing the photoelectric conversion element; and a solar cell thereof.

BRIEF DESCRIPTION OF THE DRAWINGS

Embodiments will now be described, by way of example only, with reference to the accompanying drawing which is meant to be exemplary, not limiting, and wherein like elements numbered alike in several figures, in which:

FIG. 1 is a schematic cross-sectional view showing an example of a photoelectric conversion element of the present invention.

DESCRIPTION OF THE PREFERRED EMBODIMENTS

In order to improve the above-described problems, the inventors reached the opinion that a novel hole transfer agent exhibiting no absorption in the visible light region together with high conductivity should be developed, and after considerable effort during intensive studies for possibility of various novel materials, the inventors have found out s polymeric hole transfer agent having a novel isothianaphthene structure.

The above-described problems of the present invention are solved with a photoelectric conversion element having the following structure and a solar cell thereof.

(Structure 1)

A photoelectric conversion element comprising a substrate and provided thereon, a first electrode, a photoelectric conversion layer comprising a semiconductor and a sensitizing dye, a hole transport layer and a second electrode, wherein the hole transport layer comprises a polymer comprising a repeating unit represented by Formula (1) or Formula (2):

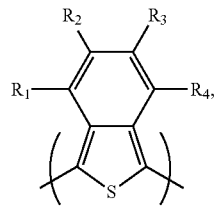

Formula (1)

where at least one of $R_1$, $R_2$, $R_3$ and $R_4$ is a halogen atom or a CN group, and each of those substituents other than the at least one is a hydrogen atom; and

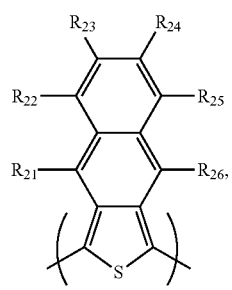

Formula (2)

where at least one of $R_{21}$, $R_{22}$, $R_{23}$, $R_{24}$, $R_{25}$ and $R_{26}$ is a halogen atom or a CN group, and each of those substituents other than the at least one is a hydrogen atom.

(Structure 2)

The photoelectric conversion element of Structure 1, wherein at least one of $R_2$ and $R_3$ in Formula (1) is a halogen atom or a CN group and each of those substituents other than the at least one is a hydrogen atom, or at least one of $R_{22}$, $R_{23}$, $R_{24}$ and $R_{25}$ in Formula (2) is a halogen atom or a CN group and each of those substituents other than the at least one is a hydrogen atom.

(Structure 3)

The photoelectric conversion element of Structure 1, wherein the polymer comprises a polymer polymerized on the photoelectric conversion layer.

(Structure 4)

The photoelectric conversion element of Structure 1 or 2, wherein the semiconductor comprises titanium oxide.

(Structure 5)

The photoelectric conversion element of any one of Structures 1-3, wherein the sensitizing dye comprises a partial structure represented by Formula (3):

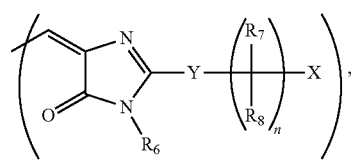

Formula (3)

where $R_6$ represents a hydrogen atom, a substituted or unsubstituted alkyl group, a substituted or unsubstituted alkenyl group, a substituted or unsubstituted alkynyl group, a substituted or unsubstituted aryl group, a substituted or unsubstituted amino group, a substituted or unsubstituted cyano group, or a substituted or unsubstituted heterocyclic group; Y represents a sulfur atom, an oxygen atom or a selenium atom; $R_7$ and $R_8$ each represent a hydrogen atom, a halogen atom, a hydroxyl group, a thiol group, a cyano group, a substituted or unsubstituted alkyl group, a substituted or unsubstituted aryl group, a substituted or unsubstituted alkenyl group, a substituted or unsubstituted alkynyl group, a substituted or unsubstituted alkoxy group, a substituted or unsubstituted amino group, or a substituted or unsubstituted heterocyclic group, and may be connected to each other to form a ring; n is an integer of 0 or more; when n≥2, $R_7$ and $R_8$ may be identical to each other or be different from each other; X represents an acidic group; and when including a carbon-carbon double bond in Formula (3), the carbon-carbon double bond may be in any of a cis arrangement and a trans arrangement.

(Structure 6)

A method of manufacturing a photoelectric conversion element comprising a substrate and provided thereon, a first electrode, a photoelectric conversion layer comprising a semiconductor and a sensitizing dye, a hole transport layer and a second electrode, comprising the step of forming the hole transport layer via electropolymerization employing a monomer or a polymer thereof represented by Formula (1') or Formula (2'):

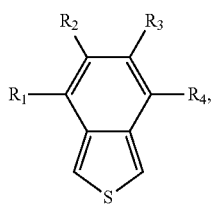

Formula (1')

where at least one of $R_1$, $R_2$, $R_3$ and $R_4$ is a halogen atom or a CN group, and each of those substituents other than the at least one is a hydrogen atom; and

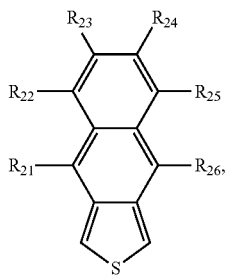

Formula (2')

where at least one of $R_{21}$, $R_{22}$, $R_{23}$, $R_{24}$, $R_{25}$ and $R_{26}$ is a halogen atom or a CN group, and each of those substituents other than the at least one is a hydrogen atom.

(Structure 7)

The photoelectric conversion element of Structure 6, wherein at least one of $R_2$ and $R_3$ in Formula (1') is a halogen atom or a CN group and each of those substituents other than the at least one is a hydrogen atom, or at least one of $R_{22}$, $R_{23}$, $R_{24}$ and $R_{25}$ in Formula (2') is a halogen atom or a CN group and each of those substituents other than the at least one is a hydrogen atom.

(Structure 8)

A solar cell comprising the photoelectric conversion element of any one of Structures 1-5.

While the preferred embodiments of the present invention have been described using specific terms, such description is for illustrative purposes only, and it is to be understood that changes and variations may be made without departing from the spirit or scope of the appended claims.

DETAILED DESCRIPTION OF THE INVENTION

It is a feature of a photoelectric conversion element of the present invention that the photoelectric conversion element possesses a substrate and provided thereon, the first electrode, a photoelectric conversion layer possessing a semiconductor and a sensitizing dye, a hole transport layer and the second electrode, wherein the hole transport layer possesses a polymer having a repeating unit represented by Formula (1) or Formula (2).

In the present invention, specifically employing the above-described specific polymer for a hole transport layer, provided are a photoelectric conversion element exhibiting excellent photoelectric conversion efficiency and excellent stability in photoelectric conversion function, in which light absorbance is reduced in the visible light region (400-700 nm) of the hole transport layer.

(Photoelectric Conversion Element)

The photoelectric conversion element of the present invention will be described referring to FIG. 1.

FIG. 1 is a schematic cross-sectional view showing an example of a photoelectric conversion element of the present invention.

As shown in FIG. 1, photoelectric conversion element 10 is composed of substrate 1, the first electrode 2, photoelectric conversion layer 6, hole transport layer 7, the second electrode 8, partition wall 9 and so forth.

Photoelectric conversion layer 6 possesses semiconductor 5 and sensitizing dye 4.

Barrier layer 3 is preferably provided between the first electrode 2 and photoelectric conversion layer 6 for the purpose of prevention of shortcircuit, sealing and so forth.

Sunlight is incident from the arrow direction in the lower portion of the drawing.

A production example of a photoelectric conversion element of the present invention will be described below.

After attaching barrier layer 3 onto the first electrode 2 provided on substrate 1, a semiconductor layer comprising a semiconductor is formed on barrier layer 3 to form photoelectric conversion layer 6 via adsorption of a sensitizing dye on the semiconductor surface. Then, hole transport layer 7 is formed on photoelectric conversion layer 6.

Hole transport layer 7 penetrates a photoelectric conversion layer composed of a semiconductor in which a sensitizing dye is carried, and is present on the photoelectric conversion layer to attach the second electrode 8 onto the photoelectric conversion layer. Current can be derived by providing terminals to the first electrode 2 and the second electrode 8.

(Hole Transport Layer)

The hole transport layer is a layer to rapidly reduce an oxidant of a sensitizing dye after injecting electrons into a semiconductor via light absorption to serve as a function to transport holes injected at the interface of the dye into the second electrode The hole transport layer possesses a polymer having a repeating unit represented by Formula (1) or Formula (2).

Since the polymer having a repeating unit represented by Formula (1) or Formula (2) has a resonance structure to transport charge, excellent transportability is assumed to be generated, and specifically when substituents of $R_1$ and $R_4$ in Formula (1) and $R_{21}$ and $R_{26}$ in Formula (2) each are a hydrogen atom, excellent photoelectric conversion efficiency and stability are obtained. This reason is presumably that not only flatness is improved, but also resonance stability is increased by suppressing steric hindrance of repeating units adjacent to each other, probably steric hindrance of repeating units of a thiophene sulfur atom and a neighboring one, $R_1$ and $R_4$ in Formula (1) or $R_{21}$ and $R_{26}$ in Formula (2).

The polymer having a repeating unit represented by Formula (1) or Formula (2) can be obtained via a method by which at least one monomer corresponding to the repeating unit, as necessary, is polymerized or copolymerized with a monomer other than the at least one monomer in the presence of a metal complex for a polymerization catalyst.

A monomer corresponding to the foregoing repeating unit represented by Formula (1) or Formula (2) (hereinafter, referred to as an isothianaphthene based monomer) is exemplified, but the present invention is not limited thereto.

The monomer corresponding to a repeating unit represented by Formula (1) or Formula (2) is a monomer represented by Formula (1') or Formula (2'), and $R_1$, $R_2$, $R_3$ and $R_4$, and $R_{21}$, $R_{22}$, $R_{23}$, $R_{24}$, $R_{25}$ and $R_{26}$ in a monomer structure represented by Formula (1') or Formula (2') are identical to those in a structure of a repeating unit represented by Formula (1) or Formula (2).

Monomer Corresponding to Repeating Unit of Formula (1)

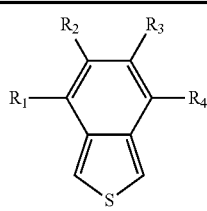

| Kinds of monomers | $R_1$ | $R_2$ | $R_3$ | $R_4$ |
|---|---|---|---|---|
| M1-1 | Cl | H | H | H |
| M1-2 | H | Cl | H | H |
| M1-3 | H | Cl | Cl | H |
| M1-4 | Cl | Cl | Cl | Cl |
| M1-5 | F | H | H | H |
| M1-6 | H | F | H | H |
| M1-7 | H | F | F | H |
| M1-8 | F | F | F | F |
| M1-9 | H | CN | CN | H |

Monomer Corresponding to Repeating Unit of Formula (2)

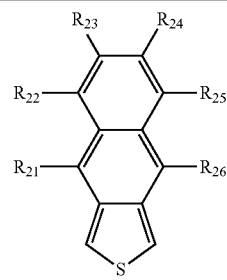

| Kinds of monomers | $R_{21}$ | $R_{22}$ | $R_{23}$ | $R_{24}$ | $R_{25}$ | $R_{26}$ |
|---|---|---|---|---|---|---|
| M2-1 | Cl | H | H | H | H | H |
| M2-2 | H | H | Cl | H | H | H |
| M2-3 | Cl | H | H | H | H | Cl |
| M2-4 | H | H | Cl | Cl | H | H |
| M2-5 | H | Cl | Cl | Cl | Cl | H |
| M2-6 | Cl | Cl | Cl | Cl | Cl | Cl |
| M2-7 | F | H | H | H | H | H |
| M2-8 | H | H | F | H | H | H |
| M2-9 | F | H | H | H | H | F |
| M2-10 | H | H | F | F | H | H |
| M2-11 | H | F | F | F | F | H |
| M2-12 | F | F | F | F | F | F |

In addition, the above-described isothianaphthene based monomer preferably use those obtained by polymerizing a dimer or a trimer (oligomerized compound) prior to polymerization or co polymerization.

(Synthetic Example of Isothianaphthene Based Monomer)

Unsubstituted isothianaphthene exhibits high reactivity and instability, and is known as a compound difficult to be handled. In order to improve this drawback, an isothianaphthene based monomer substituted by halogen and a CN group is used in the present invention, and preferably used as a stable monomer during polymerization by making the monomer to be a dimer or a trimer.

This isothianaphthene based monomer can be synthesized by a commonly known method.

Further, a diner of the above-described isothianaphthene based monomer can be synthesized by the method disclosed in the following reference.

Zhu, S. Sherry; Swager, Timothy M. Journal of the American Chemical Society, 1997, vol. 119, #51 p. 12568-12577

In addition, when using a polymer such as a dimmer or the like, oxidation potential tends to be reduced during formation of a polymer, and a synthetic rate of the polymer is preferably reduced in comparison to the case of a monomer.

(Polymerization Method of Polymer Relating to the Present Invention)

As a polymerization method, there are a chemical polymerization method in which a polymerization catalyst is used, an electropolymerization method by which reaction is produced by applying a voltage between electrodes whose poles are at least an acting electrode and a counter electride, and a photopolymerization method via exposure thereof to light or a photopolymerization method in combination with a polymerization catalyst, heating, electrolyzation and so forth, but the electropolymerization method as a polymerization method is preferable.

In cases where a polymer is prepared via an electropolymerization method, synthesis of the polymer leads to formation of the foregoing hole transport layer as it is. That is, the following electropolymerization method is carried out.

A monomer corresponding to a repeating unit of Formula (1) or Formula (2), or a dimer of the monomer is dissolved in acetonitrile, tetrahydrofuran, propylenecarbonate, dichloromethane, o-dichlorobenzene, dimethylformamide or the like, and any of salts such as lithium perchlorate, lithium tetrafluoroborate, tetrabutylammonium perchlorate, Li[(CF$_3$SO$_2$)$_2$N] or the like is added into the resulting as a supporting electrolyte to prepare a solution for electropolymerization.

The solvent is not limited as long as it is one which can dissolve a supporting electrolyte, and a monomer or a dimer of the monomer. As the supporting electrolyte, used is an ionizable one, and it is not limited to a specific one.

One exhibiting high solubility to a solvent, and insusceptible to oxidation and reduction is preferably used.

Next, substrate 1 on which transparent conductive film 2, barrier layer 3, and photoelectric conversion layer 6 is formed is immersed in this solution for electropolymerization; photoelectric conversion layer 6 is used as an acting electrode; a platinum plate or the like is used as a counter electrode; and Ag/Aga or the like is used as a reference electrode in a method of conducting DC current electrolysis. The foregoing monomer or a dimer of the monomer in the solution for electropolymerization preferably has a concentration of roughly 0.1-1000 mmol/L, and the supporting electrolyte preferably has a concentration of roughly 0.1-2 mol/L. The applied current density is preferably in the range of 0.01-1000 mA/cm$^2$, and more preferably in the range of 1-500 mA/cm$^2$. As the temperature range of the solution for electropolymerization, the range where the solution is neither solidified, nor boiled is appropriate, and conventionally in the range of from −30° C. to 80° C. Since the conditions of electrolysis voltage, electrolysis current, electrolysis time, temperature and so forth depend on materials to be used, appropriate selection thereof can be made, further depending on film thickness to be used.

In the case of a polymer prepared via electropolymerization, a polymerization degree of the polymer is difficult to be checked, but since solvent solubility of a hole transport layer formed after polymerization largely drops, as a method of confirming whether or not it is a polymer, the hole transport layer is immersed in tetrahydrofuran (THF) as a solvent capable of dissolving a monomer corresponding to a repeating unit of Formula (1) or Formula (2) to determine the polymerization degree via solubility thereof.

Specifically, the case where a dissolved compound, at a time when 10 mg of a compound (polymer) are taken out from a 25 ml sample bottle and charged in 10 ml of THF, and the resulting is exposed to ultrasonic waves (150, produced by Ultrasonic Engineering Co., Ltd. at 25 kHz, 150 W, a collector current of 1.5 A) for 5 minutes, appears to be 5 ml or less is specified as "being polymerized".

On the other hand, when conducting chemical polymerization with a polymerization catalyst, the monomer corresponding to a repeating unit of Formula (1) or Formula (2), or a dimer of the monomer is polymerized with the following polymerization catalyst. That is, examples thereof include iron(III)chloride, iron(III)tris-p-toluene sulfonate, iron(III)p-dodecylbenzene sulfonate, iron(III)methane sulfonate, iron (III)p-ethylbenzene sulfonate, iron(III)naphthalene sulfonate, and their hydrates or the like.

A polymerization rate modifier utilized for chemical polymerization is a weak complexing agent with respect to ferric ions in the foregoing polymerization catalyst, the present invention is not limited thereto as long as it is one capable of reducing the polymerization rate for formation of a film, but in cases where the polymerization catalyst is iron (III) chloride or a hydrate thereof, an aromatic oxysulfonic acid such as 5-sulphosalicylic acid or the like can be provided, and in cases where the polymerization catalyst is iron(III)tris-p-toluene sulfonate, iron(III)p-dodecylbenzene sulfonate, iron(III) methane sulfonate, iron(III)p-ethylbenzene sulfonate, iron (III)naphthalene sulfonate or a hydrate thereof, imidazole or the like can be provide.

A polymer is contained in a coating solution containing the polymer may be supplied onto a photoelectric conversion layer, but polymerization is preferably carried out on a photoelectric conversion layer to form a hole transport layer.

In this case, for synthesis to polymerize the polymer, employed are a monomer corresponding to a repeating unit of Formula (1) or Formula (2), or a dimer of the monomer, and a hole transport layer forming solution containing the foregoing polymerization catalyst, the foregoing polymerization rate modifier and other additives. The total content of each of the above-described components in the hole transport layer forming solution is generally in the range of 1-50% by weight, depending on the foregoing monomer corresponding to a repeating unit of Formula (1) or Formula (2), or a dimer of the monomer to be used, and each kind and a ratio in quantity thereof of the foregoing polymerization catalysts, the foregoing polymerization rate modifiers, the condition with respect to a coating method, and desired thickness after polymerization.

Polymerization reaction is conducted after coating the foregoing hole transport layer fanning solution on a photoelectric conversion layer by each of various coating methods, or by immersing the photoelectric conversion layer in the foregoing hole transport layer forming solution.

The condition of polymerization reaction depends on the foregoing monomer corresponding to a repeating unit of Formula (1) or Formula (2), or a dimer of the monomer to be used, and each kind and a ratio in quantity thereof, the concentration, a liquid film thickness at the stage of coating and the desired polymerization rate of the foregoing polymerization catalysts and the foregoing polymerization rate modifiers, but as the preferred polymerization condition, the heating temperature is preferably in the range of 25-120° C. in the case of heating in air, and the heating duration is preferably in the range of from one minute to 24 hours.

The polymer of the present invention has a repeating unit represented by Formula (1) or Formula (2), but a different repeating unit other than the repeating unit can be possessed in combination in the range where the effect of the present invention is not deteriorated. As an example of possessing it in combination, for example, provided can be a repeating unit introduced from a monomer such as a thiophene derivative, a pyrrole derivative, a furan derivative or the like.

Further, as a repeating unit to be possessed in combination, a divalent organic group having a π conjugate structure shown as the following Formula (4) is preferable.

                                       Formula (4)

In Formula (4), Ar represents a divalent organic group having a π conjugate structure. Herein, "π conjugate structure" means a structure in which a multiple bond and a single bond are alternately connected. When an organic group having a π conjugate structure is present in a polymer, the π conjugate plane of the polymer expands, and the moiety of a repeating unit represented by Formula (1) or Formula (2) exhibits a high electron-releasing property, whereby properties of a p-type semiconductor are further improved.

When a hole transport layer is formed via coating, the foregoing hole transport layer forming solution is used, but as a solvent for the coating solution, provided are organic solvents such as polar solvents, for example, tetrahydrofuran (THF), butyleneoxide, chloroform, cyclohexanone, chlorobenzene, acetone, and various alcohols; and aprotic solvents, for example, dimethylformamide (DMF), acetonitrile, dimethylethane, dimethylsulfoxide and hexamethylphosphoric acid triamide; and so forth. These are usable singly or in combination with at least two kinds.

Each of various additives such as $N(PhBr)_3$ $SbCl_6$, $Li[(CF_3SO_2)_2N]$ and so forth may be added into a hole transport layer, if desired.

Various coating methods such as dipping, dropping, a doctor blade, spin coating, brush coating, spray coating, a roll coater are usable as the coating method.

Further, a multilayer is formed by repeating such a coating process.

The polymer having a repeating unit of Formula (1) or Formula (2) in a hole transport layer preferably has a content of 50-100% by weight, and more preferably has a content of 90-100% by weight.

Since hole doping should be made to increase conductivity of a hole transport layer of the present invention, a hole doping amount per a repeating unit represented by Formula (1) or Formula (2) is preferably 0.15-0.66 (number).

In the case of electropolymerization, an electric field is applied to a polymer having a repeating unit represented by Formula (1) or Formula (2) for oxidation, whereby hole doping can be carried out.

Further, in order to reduce an oxidizing body of a sensitizing dye in a photoelectric conversion layer, a polymer of the present invention should have smaller ionization potential than dye adsorption electrode ionization potential. For this reason, the preferred ionization potential range of the polymer of the present invention depends on the utilized sensitizing dye, but it is preferably in the range between 4.5 and 5.5 eV, and more preferably in the range between 4.7 and 5.3 eV.

The reason why a photoelectric conversion element exhibiting excellent stability in photoelectric conversion efficiency and photoelectric conversion function when using a hole transport layer of the present invention is not clear, but it is assumed as described below.

The absorption of a conductive polymer in the visible and infrared region (a wavelength of 400 nm or more) is originated from those 3 items described below.

[1] $\pi$-$\pi$ *transition of a neutral conjugate polymer (a wavelength of 400-700 nm)
[2] absorption with polaron (a wavelength of 500-1500 nm)
[3] absorption with bipolaron (a wavelength of 1000 nm or more)

In order to be transparent in the visible light region (a wavelength of 400-700 nm), it should be designed to allow only [3] via suppression of the absorption of [1] and [2]. When a hole doping amount per a single unit is in the range of 0.15-0.66, a presence ratio of polaron and a neutron conjugate portion in a polymer is reduced, whereby the main component constituting a polymer chain becomes bipolaron. When the polymer is composed of a repeating unit represented by Formula (1) and Formula (2), the neutral conjugate portion and polaron are further reduced by accelerating formation of bipolaron, whereby visible light transparency is further improved. Since loss of visible light caused by absorption of a polymer is reduced, visible light acting on a sensitizing dye increases, leading to, as a result, generation of improved photoelectric conversion efficiency.

Further, a polymer itself has low visible light absorbance, and deterioration caused by light is suppressed, leading to stability in photoelectric conversion function.

Accordingly, since optical loss caused by adsorption is small when the visible light absorbance is lo, and the deterioration caused by light is suppressed, a hole transport layer preferably has a light absorbance of 1.0 or less. On the other hand, since the light absorbance becomes slightly high when a polymerization degree of the polymer is increased, a charge transport layer having a polymerization degree, which exhibits a light absorbance of 0.2 or more, as the light absorbance, is preferable in order to obtain a polymerization degree exhibiting preferred hole transport ability.

Herein, a light absorbance difference of an acting electrode before and after electropolymerization was used as a light absorbance of a hole transport layer. The light absorbance was measured employing a spectrophotometer (JASCO V-530). As an acting electrode, one in which a dye was adsorbed onto a titanium oxide thin film having an effective area of $10\times20$ mm$^2$, which was formed on an FTO conductive glass substrate, was used, and it was increased in a solution having the same composition as that of the foregoing electropolymerization solution. After the counter electrode was formed from a platinum wire, a reference electrode was made from $Ag/Ag^+$ ($AgNO_3$ 0.01M), and a holding voltage was set to $-0.16$ V, a polymer having a repeating unit of Formula (1) and Formula (2) was formed on the foregoing acting electrode via exposure to light from the semiconductor layer direction by maintaining the voltage for 30 minutes. In order to correct influence produced from variation in film thickness, film thickness of a sample was measured, and a value divided by film thickness ($\mu$m) was used. The film thickness measurement was done with Dektak 3030 (manufactured by SLOAN TECHNOLOGY Co.).

The polymer having a repeating unit represented by Formula (1) or Formula (2) preferably has a light absorbance of 0.2-1.0.

(Substrate)

A substrate is provided on the light-incident side. The substrate preferably has a light transmittance of 10% or more; more preferably has a light transmittance of 50% or more; and most preferably has a light transmittance of 80-100%.

The light transmittance means total light transmittance in the visible light wavelength region, which is measured by a method in accordance with JIS K 7361-1 (corresponding to ISO 13468-1) "Plastics—Determination of the total luminous transmittance of transparent materials".

Substrates with those commonly known such as material, shape, structure, thickness, hardness and so forth can be appropriately selected, but preferably exhibit high optical transparency as described above.

Examples of the substrate include a polyester based resin film such as polyethylene terephthalate (PET), polyethylene naphthalate, modified polyester or the like; a polyolefin based resin film such as a polyethylene (PE) resin film, a polypropyrene (PP) resin film, a polystyrene resin film, a cyclic olefin based resin or the like; a vinyl based resin film such as polyvinyl chloride, polyvinylidene chloride or the like; a polyvinyl acetal resin film such as polyvinyl butyral (PVP) or the like; a polyetherether ketone (PEEK) resin film; a polysulphone (PSF) resin film; a polyethersulphone (PES) resin film; a polycarbonate resin film; a polyamide resin film; a polyamide resin film; an acrylic resin film; a triacetyl cellulose (TAC) resin film and so forth. In organic glass films other than these resin films may be used as the sunstrate.

If the resin film has a light transmittance of 80% or more in the visible light wavelength region (380-780 nm), it is preferably applicable for the present invention.

Among the above-described, a biaxially-stretched polyethylene terephthalate film, a biaxially-stretched polyethylene naphthalate film, a polyethersulphone film and a polycarbonate film are preferable, and a biaxially-stretched polyethylene terephthalate film and a biaxially-stretched polyethylene naphthalate film are more preferable in view of transparency, heat resistance, easy handling, strength and cost.

These substrates can be subjected to a surface treatment, and an adhesion increasing layer can be provided for each of these substrates in order to acquire wettability of a coating solution and adhesion thereof.

As to a surface treatment or an adhesion increasing layer, a commonly known technique can be used conventionally. For example, as the surface treatment, provided can be a surface activation treatment such as a corona discharge treatment, a flame treatment, a UV treatment, a high-frequency treatment, a glow discharge process, an activated plasma treatment and a laser treatment.

Further, as the adhesion increasing layer, provided can be polyester, polyamide, polyurethane, a vinyl based copolymer, a butadiene based copolymer, an acrylic copolymer, a vinylidene based copolymer and an epoxy based copolymer.

The substrate preferably has a thickness of 1-1000 μm, and more preferably has a thickness of 10-100 μm.

(The First Electrode)

The first electrode is placed between a substrate and a photographic conversion layer.

The first electrode having a light transmittance of 80% or more, and further having a light transmittance of 90% or more is preferably used. The light transmittance is the same one as described in the explanation of the above-described substrate.

The first electrode is placed on one surface being on the opposite side with respect to the light-incident direction of the substrate.

Examples of material constituting the first electrode include metal such as platinum, gold, silver, copper, aluminum, rhodium or indium, and metal oxide such as $SnO_2$, CdO, ZnO, a CTO system ($CdSnO_3$, $Cd_2SnO_4$ or $CdSnO_4$), $In_2O_3$, $CdIn_2O_4$ or the like.

Silver is provided as preferred metal, and in order to obtain optical transparency, an opening-possessing film subjected to grid-patterning, or a film coated by dispersing particles or nanowires are preferably employed.

A composite (doped) material in which at least one selected from the group consisting of Sn, Sb, F and Al is added into the above-described metal oxide is provided as preferred metal oxide.

Among the above-described, conductive metal oxide such as Sn-doped $In_2O_3$ (ITO), Sb-doped $SnO_2$, F-doped $SnO_2$ (FTO) or the like is preferably used, and FTO is most preferable in view of heat resistance.

Herein, one, in which the first electrode is provided on a substrate, is referred to as a conductive support.

The conductive support has a film thickness of 0.1-5 mm.

Further, the conductive support preferably has a surface resistance of 50 $\Omega/cm^2$ or less, and more preferably has a surface resistance of 10 $\Omega/cm^2$ or less.

The preferred light transmittance range of a conductive support is identical to the preferred light transmittance range of the above-described substrate.

(Barrier Layer)

The photoelectric conversion element of the present invention serving as a short-circuit protection device is in the form of a film (in the form of a layer), and preferably has a barrier layer situated between the first electrode and a semiconductor layer.

A barrier layer and a photoelectric conversion layer are preferably porous, but in cases when the barrier layer has a porosity of C %, and the semiconductor layer has a porosity of D %, D/C is preferably about 1.1 or more; more preferably about 5 or more, and most preferably about 10 or more.

Each of the barrier layer and the semiconductor layer suitably exerts its function from those described above.

Specifically, the barrier layer preferably has a porosity C of about 20% or less; more preferably has a porosity C of about 5% or less; and most preferably has a porosity C of about 2% or less. That is, the barrier layer is preferably a dense layer. The foregoing effect can be improved from those described above.

The barrier layer preferably has an average thickness of approximately 0.01-10 μm, and more preferably has an average thickness of approximately 0.03-0.5 μm. The foregoing effect can be improved by those described above.

The constituting material of this barrier layer is not specifically limited, but in combination, usable is at least one selected from the group consisting of zinc, niobium, tin, titanium, vanadium, indium, tungsten, tantalum, zirconium, molybdenum, manganese, iron, copper, nickel, iridium, rhodium, chromium, ruthenium and oxides thereof; perovskite such as strontium titanate, calcium titanate, barium titanate, magnesium titanate or strontium niobate, and a composite oxide or an oxide mixture thereof; various metal compounds such as CdS, CdSe, TiC, $Si_3N_4$, SiC and BN; and so forth.

Specifically in cases where the hole transport layer is formed from a p-type semiconductor, a barrier layer when using metal for the bather layer has a smaller work function than that of the hole transport layer, and one brought into Schottky type contact is utilized. Further, in cases where metal oxide is used for the barrier layer, the barrier layer is brought into ohmic contact with a transparent conductive layer, and one in which an energy level of the conductive band is lower than that of porous semiconductor layer 4 is preferable.

In this case, the efficiency of electron transfer from the porous semiconductor layer (photoelectric conversion layer) to the barrier layer can be improved via selection of oxide.

Of these, those having electrical conductivity comparable to that of a semiconductor (photoelectric conversion layer) are preferable, and titanium oxide as a main material is more preferable.

(Photoelectric Conversion Layer)

The photoelectric conversion layer contains a semiconductor and a sensitizing dye, and is formed from a semiconductor layer containing the semiconductor in which the sensitizing dye is carried.

(Semiconductor)

Usable examples of the semiconductor employed for a semiconductor layer include an elemental substance such as silicon, germanium or the like, a compound containing an element in Groups 3-5 and Groups 13-15 of the periodic table (referred to also as the element periodic table), a metal chalcogenide such as oxide, sulfide, selenide or the like, a metal nitride, and so forth.

Preferable examples of metal chalcogenide include an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony or bismuth; a selenide of cadmium or lead; a telluride of cadmium; and so forth. Examples of other compound-semiconductors include a phosphide of zinc, gallium, indium, cadmium or the like; a selenide of gallium-arsenic or copper-indium; a sulfide of copper-indium; a nitride of titanium; and so forth.

Specific examples include $TiO_2$, $SnO_2$, $Fe_2O_3$, $WO_3$, ZnO, $Nb_2O_5$, CdS, ZnS, PbS, $Bi_2S_3$, CdSe, CdTe, GaP, Inp, GaAs, $CuInS_2$, $CuInSe_2$, $Ti_3N_4$ and so forth, but preferably usable are $TiO_2$, ZnO, $SnO_2$, $Fe_2O_3$, $WO_3$, $Nb_2O_5$, CdS and PbS;

more preferably usable are $TiO_2$ and $Nb_2O_5$; and most preferably usable is $TiO_2$ (titanium dioxide).

As a semiconductor used for a semiconductor layer, the above-described plural semiconductors may be used in combination.

For example, several kinds of the above-described metal oxide or metal sulfide may be used in combination, and 20% by weight of titanium nitride ($Ti_3N_4$) may be mixed in titanium oxide semiconductor to be used.

The zinc oxide/tin oxide composite described in J. Chem. Soc., Chem. Commun., 15 (1999) may also be applied thereto. In this case, when a component other than metal oxide or metal sulfide is added as a semiconductor, a content of such the addition component is preferably 30% by weight with respect to the metal oxide or metal sulfide semiconductor.

A semiconductor relating to the present invention may be subjected to a surface treatment employing an organic base. Preferable examples of the foregoing organic base include diarylamine, triarylamine, pyridine, 4-t-butylpyridine, polyvinylpyridine, quinoline, piperidine, amidine and so forth. Among them, pyridine, 4-t-butylpyridine and polyvinylpyridine are preferable.

In cases where the above-described organic base is liquid, a solution dissolved in an organic solvent is prepared when it is solid, and a surface treatment can be conducted by immersing a semiconductor of the present invention in liquid organic base or an organic base solution.

<<Preparation of Semiconductor Layer>>

A method of preparing a semiconductor layer will be described.

In cases where a semiconductor in the semiconductor layer is particle-shaped, the semiconductor layer may be prepared by coating or spraying particles onto a conductive support. Further, in cases where the semiconductor of the present invention is in the form of a film, and is not supported on the conductive support, the semiconductor layer is preferably prepared by attaching the semiconductor onto the conductive support.

As a preferable embodiment for the semiconductor layer, provided is a method of forming via calcination employing semiconductor particles provided on the above-described conductive support.

When a semiconductor of the present invention is prepared via calcination, the semiconductor is preferably subjected to a sensitization (adsorption, filling in a porous layer, and so forth) treatment employing a dye after calcination. After the calcination, specifically, the compound is preferably subjected to an adsorption treatment rapidly before adsorbing water to the semiconductor.

Next, a method of forming a semiconductor layer via calcination employing semiconductor particles, which is preferably utilized in the present invention, will be described in detail.

(Preparation of Semiconductor Powder-Containing Coating Solution)

First, a semiconductor powder-containing coating solution is prepared. The primary particle diameter of this semiconductor powder is preferably as fine as possible. The semiconductor powder preferably has a primary particle diameter of 1-5000 nm, and more preferably has a primary particle diameter of 2-100 nm. The coating solution containing the semiconductor powder can be prepared by dispersing the semiconductor powder in a solvent.

The semiconductor powder dispersed in the solvent is dispersed in the form of the primary particle. The solvent is not specifically limited as long as it can disperse the semiconductor powder.

As the foregoing solvent, water, an organic solvent, and a mixture of water and an organic solvent are included. As the organic solvent, alcohol such as methanol, ethanol or the like, ketone such as methyl ethyl ketone, acetone, acetylacetone, or the like and hydrocarbon such as hexane, cyclohexane or the like are usable. A surfactant and a viscosity controlling agent (polyhydric alcohol such as polyethylene glycol or the like) can be added into a coating solution, if desired. The content of the semiconductor powder in the solvent is preferably 0.1-70% by weight, and more preferably 0.1-30% by weight.

(Coating of Semiconductor Powder-Containing Coating Solution and Calcination Treatment of Formed Semiconductor Layer)

The semiconductor powder-containing coating solution obtained as described above is coated or sprayed onto the conductive support, followed by drying, and then burned in air or inactive gas to form a semiconductor layer (referred to also as a semiconductor film) on the conductive support.

The layer formed via coating the semiconductor powder-containing coating solution onto the conductive support, followed by drying is composed of an aggregate of semiconductor particles, and the particle diameter corresponds to the primary particle diameter of the utilized semiconductor powder.

The semiconductor particle layer formed on a conductive layer of the conductive support or the like in such the way is subjected to a calcination treatment in order to increase mechanical strength and to produce a semiconductor layer firmly attached to a substrate, since the semiconductor particle layer exhibits bonding force with the conductive support, as well as bonding force between particles, and also exhibits weak mechanical strength.

The semiconductor layer may have any structure, but a porous structure layer (referred to also as a porous layer possessing pores) is preferable.

When the semiconductor layer is a porous structure layer, it is preferable that components of a hole transport material or the like in a hole transport layer is present in this pore.

The semiconductor layer preferably has a porosity of 1-90% by volume or less, more preferably has a porosity of 10-80% by volume or less, and most preferably has a porosity of 20-70% by volume. In addition, the porosity of the semiconductor layer means a through-hole porosity in the direction of thickness of a dielectric, and it can be measured by a commercially available device such as a mercury porosimeter (Shimadzu Pore Analyzer 9220 type) or the like.

A semiconductor layer as a calcine film having a porous structure preferably has a thickness of at least 10 nm, and more preferably has a thickness of 500-30000 nm.

A calcination temperature of 1,000° C. or less is preferable, a calcination temperature of 200-800° C. is more preferable, and a calcination temperature of 300-800° C. is still more preferable in view acquisition of a calcine film having the above-described porosity by suitably preparing real surface area of the calcine film during calcination treatment.

In cases where the substrate is made of plastic or the like, and exhibits less heat resistance, not only fixing adhesion of particle-to-particle or particle-to-substrate can be made via pressure application without conducting a calcinations treatment, but also only the semiconductor layer can be subjected to a heat treatment via microwaves with no heat application to a substrate.

Further, a ratio of the real surface area to the apparent surface area can be controlled by a diameter and specific surface area of the semiconductor particle, the calcination temperature and so forth.

After conducting a heat treatment, chemical plating employing an aqueous solution of titanium tetrachloride or electrochemical plating employing an aqueous solution of titanium trichloride may be conducted in order to increase the surface area of a semiconductor particle and purity in the vicinity of the semiconductor particle, and to increase an electron injection efficiency from a dye to a semiconductor particle.

(Sensitizing Dye)

A sensitizing dye of the present invention is carried into a semiconductor via a sensitizing treatment as described below, and is capable of producing an electromotive force via photoexcitation. As the sensitizing dye, usable is a commonly known sensitizing dye used for a photoelectric conversion element.

The sensitizing dye preferably contains a carboxyl group in view of effective injection of charge into a semiconductor, and in cases where a polymer having a repeating unit represented by Formula (1) and Formula (2) is further contained, the sensitizing dye preferably possesses a partial structure represented by foregoing Formula (3). The reason is presumably that degradability of the dye adsorbed to a semiconductor is small in cases where electropolymerization is conducted during preparation of a photoelectric conversion element.

In formula (3), $R_6$ represents a hydrogen atom, a substituted or unsubstituted alkyl group, a substituted or unsubstituted alkenyl group, a substituted or unsubstituted alkynyl group, a substituted or unsubstituted aryl group, a substituted or unsubstituted amino group, a substituted or unsubstituted cyano group, or a substituted or unsubstituted heterocyclic group; Y represents a sulfur atom, an oxygen atom or a selenium atom; $R_7$ and $R_8$ each represent a hydrogen atom, a halogen atom, a hydroxyl group, a thiol group, a cyano group, a substituted or unsubstituted alkyl group, a substituted or unsubstituted aryl group, a substituted or unsubstituted alkenyl group, a substituted or unsubstituted alkynyl group, a substituted or unsubstituted alkoxy group, a substituted or unsubstituted amino group, or a substituted or unsubstituted heterocyclic group, and may be connected to each other to form a ring; n is an integer of 0 or more; when n≥2, $R_7$ and $R_8$ may be identical to each other or be different from each other; X represents an acidic group; and when including a carbon-carbon double bond in Formula (3), the carbon-carbon double bond may be in any of a cis arrangement and a trans arrangement.

The halogen atom represented by each of $R_7$ and $R_8$ is a chlorine atom, a bromine atom a fluorine atom or the like.

As to a substituted or unsubstituted alkyl group, a substituted or unsubstituted alkenyl group, a substituted or unsubstituted alkynyl group, a substituted or unsubstituted aryl group, a substituted or unsubstituted amino group, a substituted or unsubstituted cyano group, or a substituted or unsubstituted heterocyclic group represented by each of $R_7$ and $R_8$, examples of the alkyl group include a methyl group, an ethyl group, a propyl group, isopropyl group, a tert-butyl group, a pentyl group, a hexyl group, an octyl group, a dodecyl group, a tridodecyl group, a tetradodecyl group, a pentadodecyl group, a cyclodopentyl group, a cyclohexyl group and so forth; examples of the alkenyl group include a vinyl group, a 1-propenyl group, 2-propenyl group, 2-butenyl group, an allyl group and so forth; examples of the alkynyl group include a propargyl group, a 3-pentynyl group and so forth; examples of the aryl group include a phenyl group, a naphtyl group, an anthracenyl group and so forth; examples of the heterocyclic group include a furanyl group, a thienyl group, an imidazolyl group, a thiazolyl group, a morphonyl group and so forth; and examples of the alkoxy group include a methoxy group, an ethoxy group, a propoxy group, a butoxy group and so forth X represents an acidic group, and examples of the acidic group include a carboxyl group, a sulfo group, a sulfino group, a sulfinyl group, a phosphoryl group, a phosphinyl group, a phosphono group, a phosphonyl group, a sulfonyl group, and a salt thereof. A carboxyl group and a sulfo group are preferable.

Examples of the substituent include an alkyl group such as a methyl group, an ethyl group, a propyl group, isopropyl group, a tert-butyl group, a pentyl group, a hexyl group, an octyl group, a dodecyl group, a tridodecyl group, a tetradodecyl group, a pentadodecyl group, a cyclodopentyl group, a cyclohexyl group or the like; alkenyl group such as a vinyl group, a 1-propenyl group, 2-propenyl group, 2-butenyl group, an allyl group or the like; examples of the aryl group include a phenyl group, a naphtyl group, an anthracenyl group or the like; a hydroxyl group; an amono group; a thiol group; a cyano group; a halogen atom such as a chlorine atom, a bromine atom, a fluorine atom or the like; and a heterocyclic group such as a pyrrolidyl group, an imidazolidyl group, a morpholyl group, an oxazolidyl group, a 2-tetrahydrofuranyl group, a 2-tetrahydrothienyl group, a 2-tetrahydropyranyl group, a 3-tetrahydropyranyl group or the like. Further, these plural substituents may be connected to each other to form a ring.

Specific examples of the sensitizing dye are shown below, but the present invention is not limited thereto.

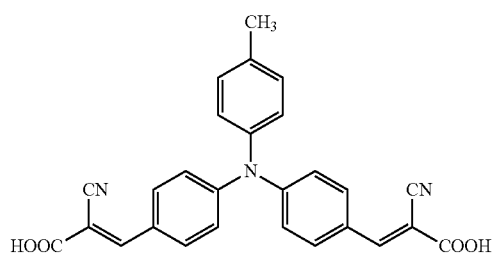

D-1

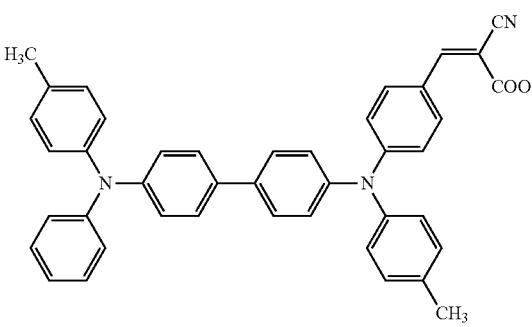

D-2

-continued
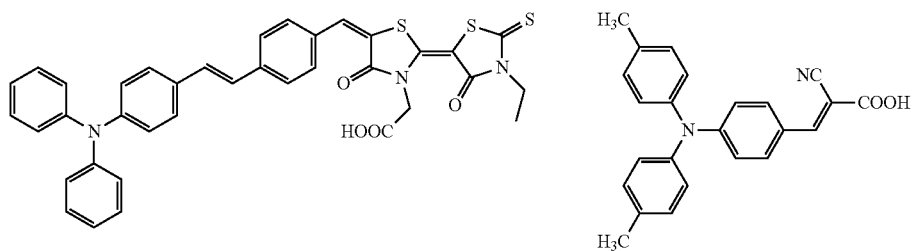
D-3
D-4
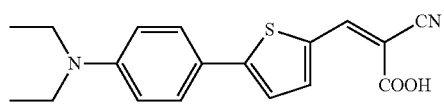
D-5
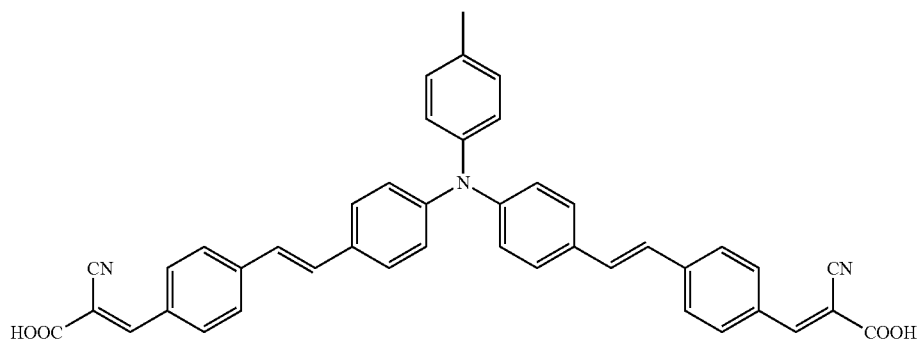
D-6
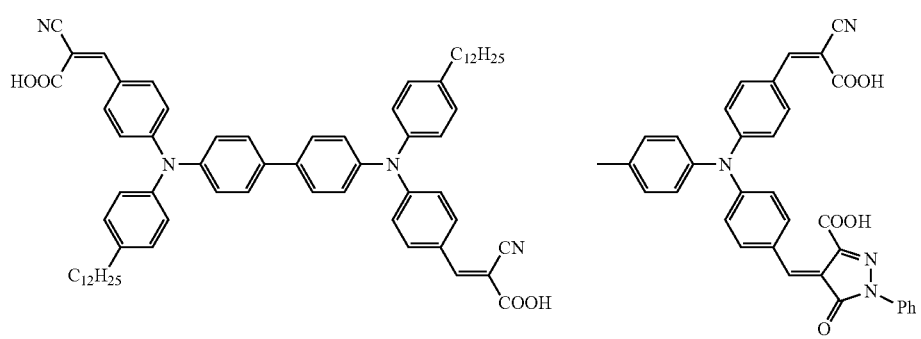
D-7
D-8
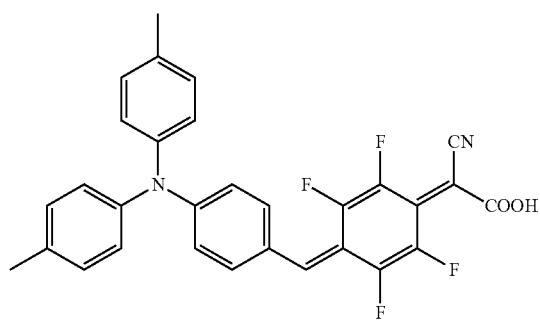
D-9

-continued
D-10
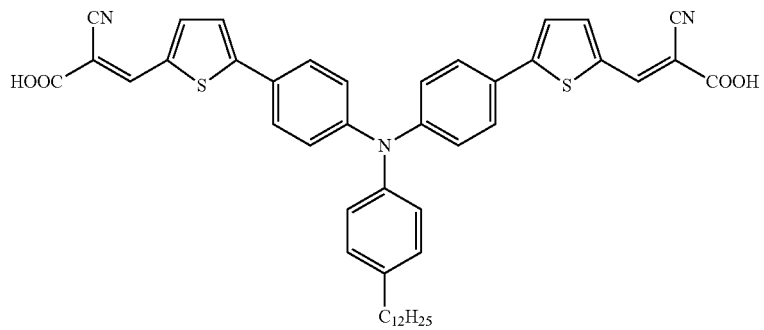
D-11
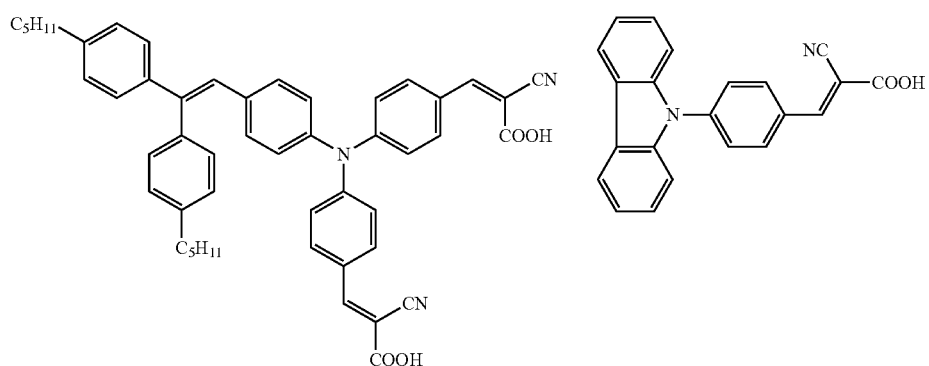
D-12
D-13
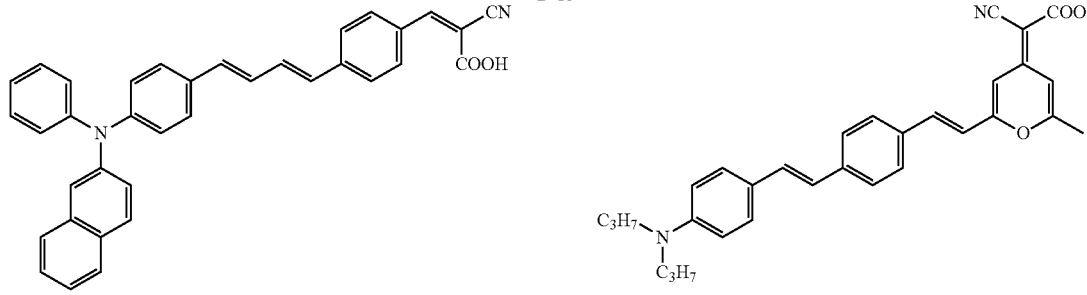
D-14
D-15
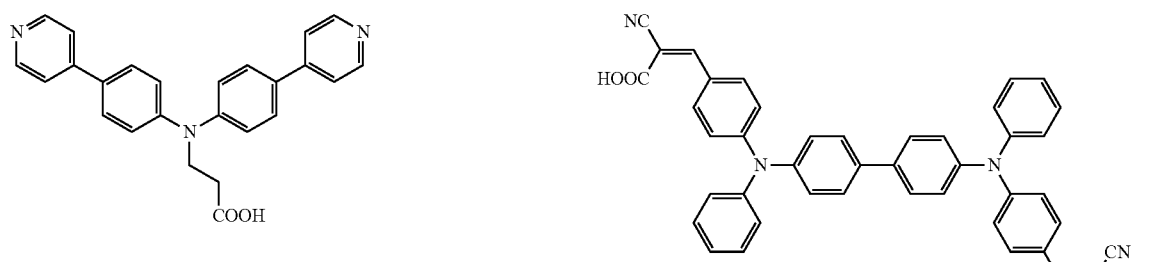
D-16
D-17
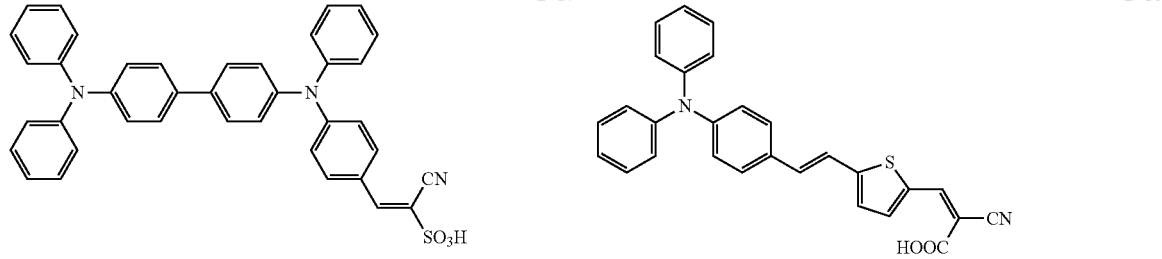
D-18

-continued
D-19
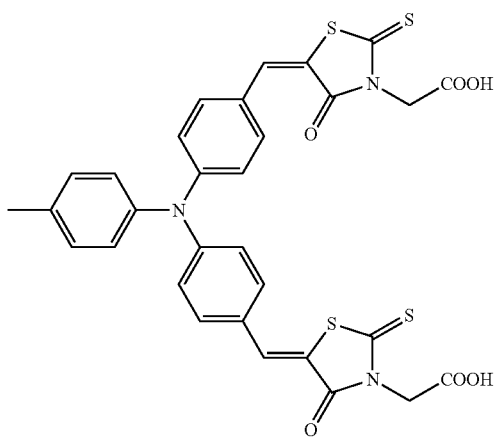
D-20
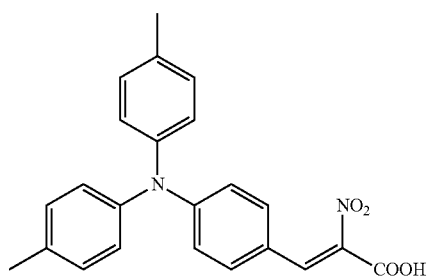
D-21
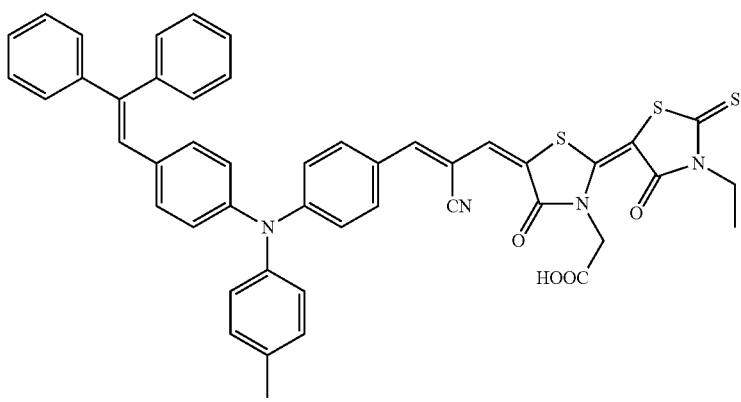
D-22
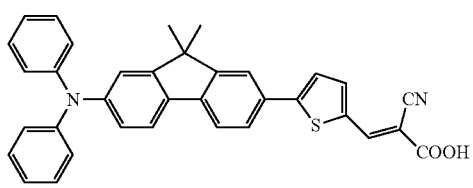
D-23
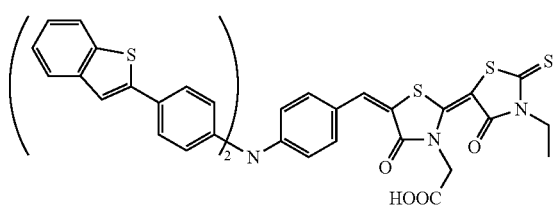
D-24
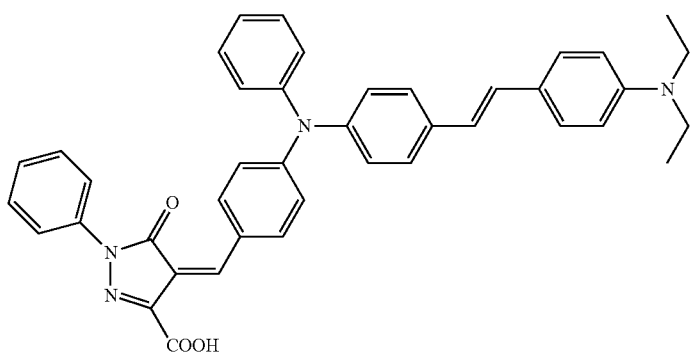

-continued
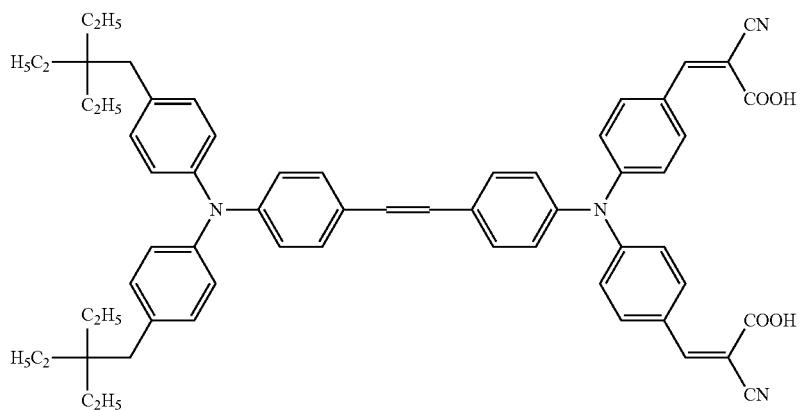
D-25
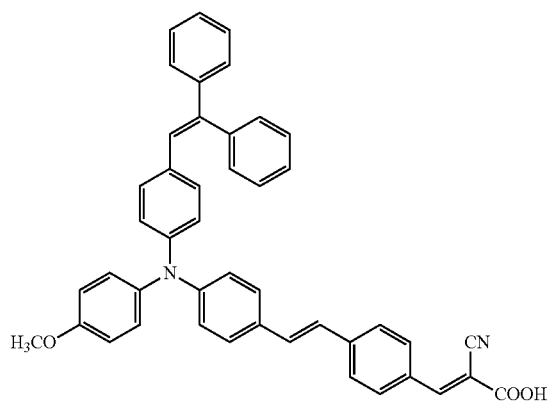
D-26
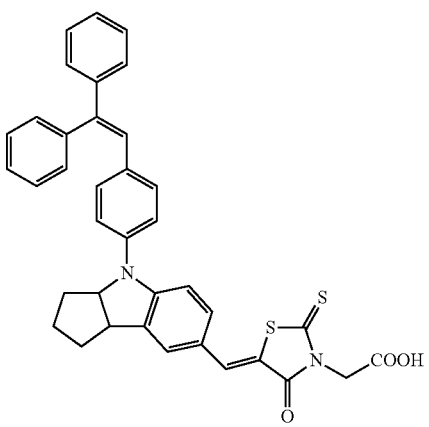
D-27
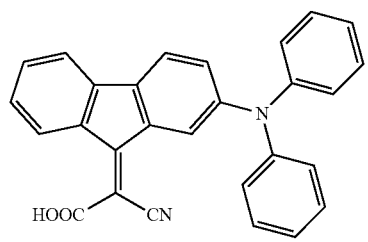
D-28
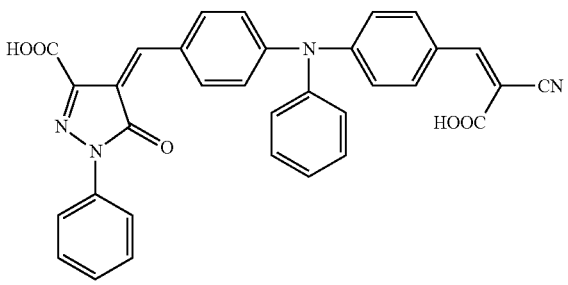
D-29
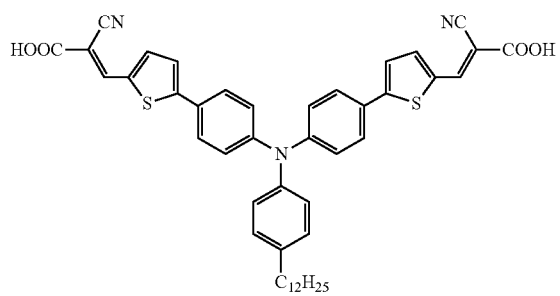
D-30
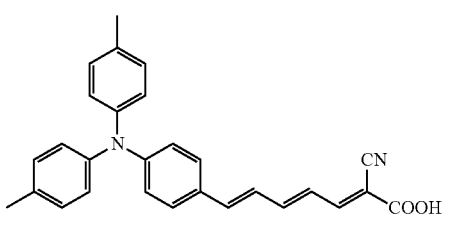
D-31

-continued
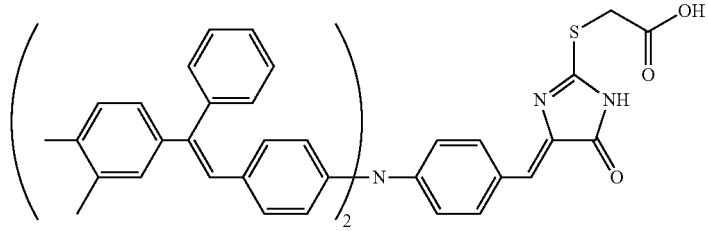
D-32
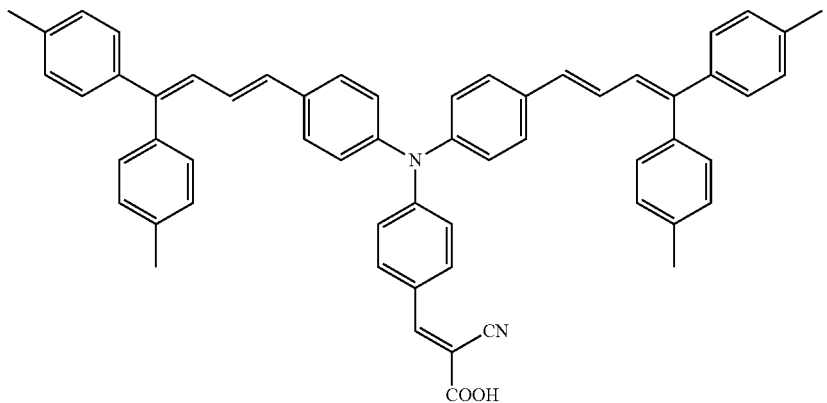
D-33
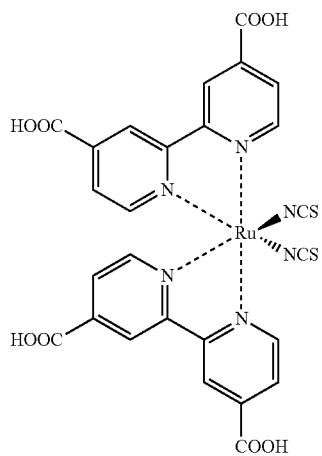
D-34
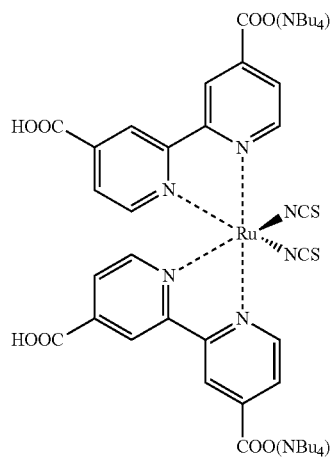
D-35
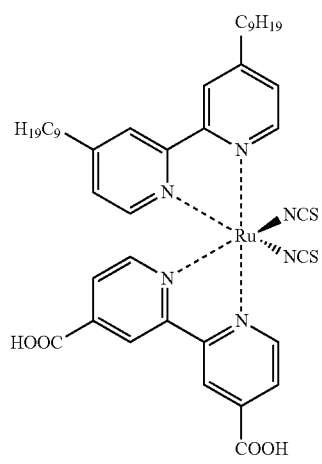
D-36
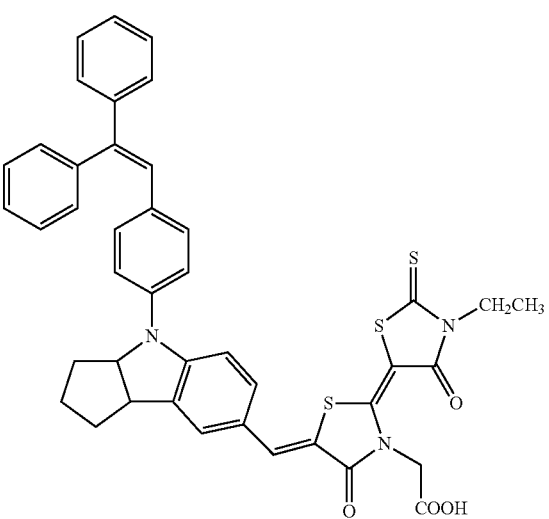
D-37

-continued
D-38
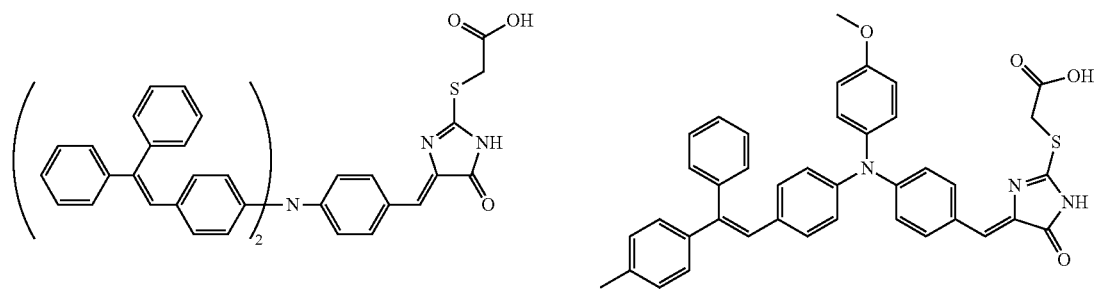
D-39
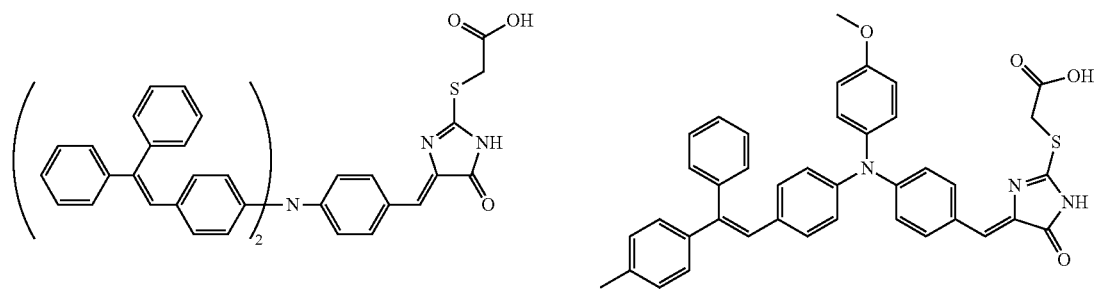
D-40
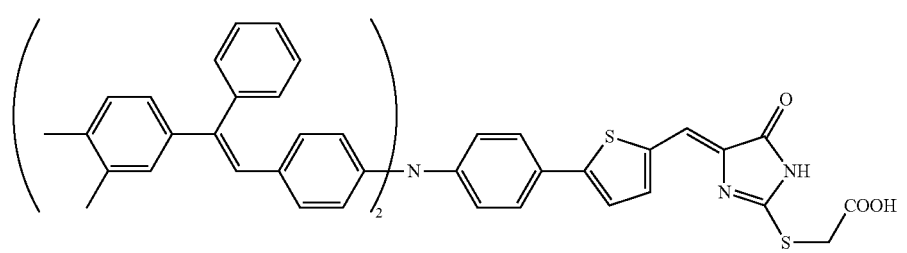
D-41
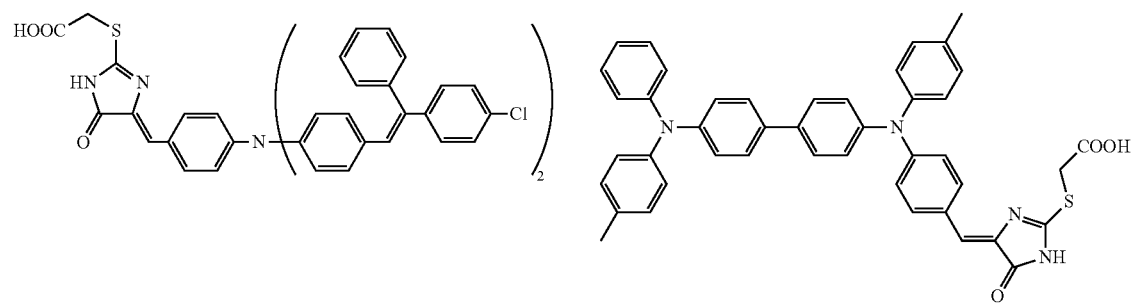
D-42
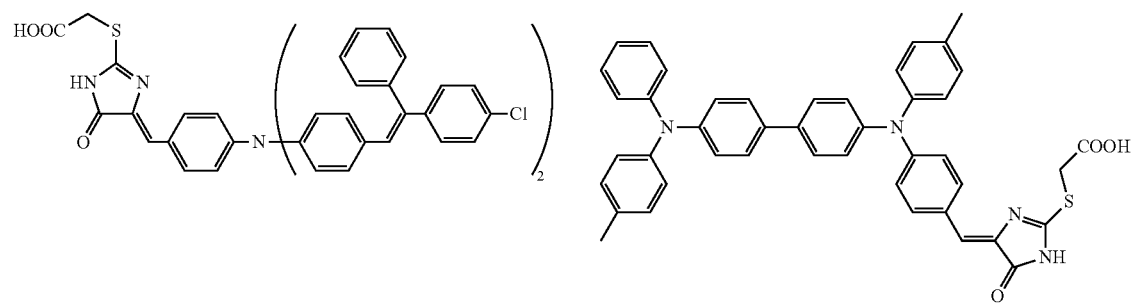
D-43
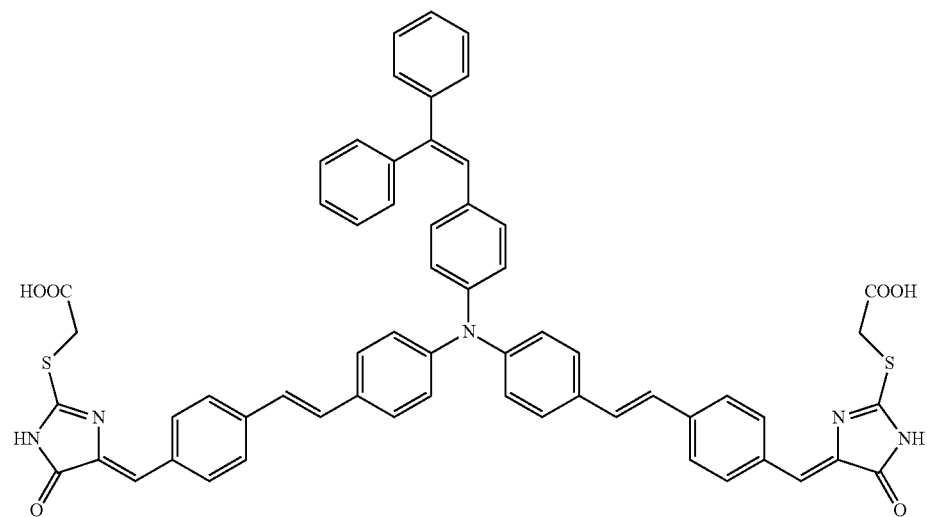

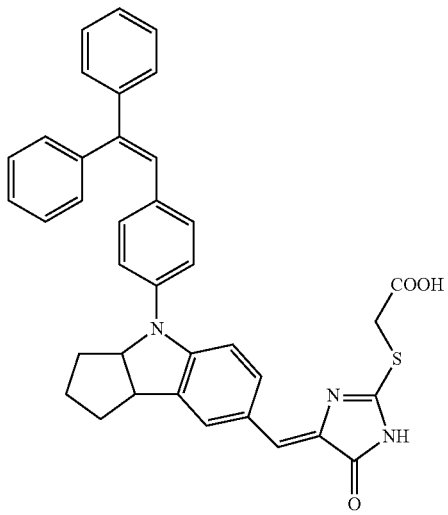

D-44

The total carrying amount of a sensitizing dye of the present invention per $m^2$ of a semiconductor layer is preferably 0.01-100 mmol, more preferably 0.1-50 mmol, and still more preferably 0.5-20 mmol.

When conducting a sensitization treatment, the sensitizing dye may be used singly or in combination with at least two kinds. Further, the sensitizing dye can be mixed in combination with other compounds, and examples thereof include compounds disclosed in U.S. Pat. No. 4,927,721, U.S. Pat. No. 5,084,365, U.S. Pat. No. 5,350,644, U.S. Pat. No. 5,463,057, U.S. Pat. No. 5,525,440, Japanese Patent O.P.I. Publication No. 7-249790, and Japanese Patent O.P.I. Publication No. 2000-150007.

Specifically in the case of the photoelectric conversion element of the present invention used for a solar cell, at least two dyes differing in absorption wavelength ranges are preferably used, so that the wavelength region for photoelectric conversion is expanded as broad as possible to achieve effective utilization of solar light.

In order to carry a sensitizing dye with a semiconductor, generally, the sensitizing dye is dissolved in an appropriate solvent (ethanol or the like) and a well-dried semiconductor is immersed into the solution for a long duration.

When using plural kinds of sensitizing dyes or using the sensitizing dye in combination with other sensitizing dyes to conduct a sensitizing treatment, a mixed solution of each of the dyes may be prepared, or an individual solution for each of the dyes may be produced to prepare it via immersion of each of the solutions in order.

When preparing an individual solution for each of the sensitizing dyes to prepare it via immersion of each of the solutions in order, introduction of sensitizing dyes into a semiconductor may be done in any order.

Further, preparation thereof can be made by mixing semiconductor particles onto which the foregoing sensitizing dye is individually adsorbed.

Further, in the case of a semiconductor having high porosity, it is preferred to subject the semiconductor to an adsorption treatment of the sensitizing dye before moisture or water vapor is adsorbed onto the semiconductor surface or into pores in the interior of the semiconductor.

As described above, a sensitizing dye is appropriately dissolved in a solvent, and a substrate with the foregoing calcined semiconductor is immersed in the resulting solution to conduct a sensitizing treatment for the semiconductor.

In this case, air bubbles in the film are preferably removed via a depressurizing treatment or a heat treatment in advance from a substrate formed via calcination of a semiconductor layer (referred to also as a semiconductor film). By conducting such a treatment, a sensitizing dye can be designed to be deeply penetrated into the inside of the semiconductor layer (semiconductor film), and the case where the semiconductor layer (semiconductor film) is a film having a porous structure is specifically preferable.

The solvent used for dissolving a sensitizing dye is not specifically limited, as long as it does not dissolve or react the semiconductor, but can dissolve the sensitizing dye.

However, digassing and distillation purification in advance are preferable in order to avoid suppression of a sensitizing treatment such as adsorption of a sensitizing dye, or the like via penetration of a water content and gas dissolved in the solvent into the semiconductor film.

Examples of preferably usable solvents for dissolving the sensitizing dye include a nitrile based solvent such as acetonitrile or the like; an alcohol based solvent such as methanol, ethanol, n-propanol or the like; a ketone based solvent such as acetone, methylethyl ketone or the like; an ether based solvent such as diethyl ether, diisopropyl ether, tetrahydrofuran, 1,4-dioxane or the like; a halogenated hydrocarbon solvent such as methylene chloride, 1,1,2-trichloroethane or the like; and a mixture of plural solvents thereof. Specifically preferable are acetonitrile, a mixed solvent of acetonitrile and methanol, methanol, ethanol, acetone, methylethyl ketone, tetrahydrofuran and methylene chloride.

(Temperature and Duration of Sensitizing Treatment)

As to a duration of immersing a substrate with a calcined semiconductor in a solution containing a sensitizing dye, the solution is deeply penetrated into a semiconductor layer (semiconductor film) to sufficiently accelerate adsorption thereof or the like, whereby the semiconductor is preferred to be sufficiently sensitized.

In order to avoid suppression of adsorption of a dye, caused by a decomposing material produced via decomposition of the dye in the solution, the duration is preferably 3-48 hours, and more preferably 4-24 hours at 25° C.

This effect is vividly produced specifically in cases where the semiconductor film is a film having a porous structure.

However, the immersion duration is a duration at 25° C., but this condition is allowed when the temperature condition is varied.

In order to conduct immersion, a solution containing a dye employed in the present invention may be heated up to the temperature of no boiling, as long as the foregoing dye is not decomposed. The temperature range is preferably 5-100° C., and more preferably 25-80° C., as long as the solution is not boiled in the foregoing temperature range.

The second electrode may be one exhibiting conductivity, and any conductive material is optionally usable. A material exhibiting insulation is also usable, as long as a conductive material layer is provided on the side facing the hole transport layer.

It is preferably to be brought into good contact with the hole transport layer. There also appears a small work function with the hole transport layer, and it is preferred to exhibit chemical stability. As such a material, usable are a thin film made of metal such as gold, silver, aluminum, platinum or the like, and an organic conductive material such as carbon black, a conductive polymer or the like.

(Solar Cell)

A solar cell of the present invention possesses a photoelectric element of the present invention as described above.

A solar cell of the present invention possessing a photoelectric conversion element is designed to be optimized for circuit design to solar light, and has a structure capable of performing optimum photoelectric conversion when sunlight is utilized as a light source.

That is, a structure capable of being able to expose a dye-sensitized semiconductor to sunlight has been realized. When a solar cell of the present invention is designed to be provided, it is preferred that the foregoing photoelectric conversion layer, hole transport layer and the second electrode are stored in a case and sealed, or they are entirely resin-sealed.

When the solar cell of the present invention is exposed to sunlight or electromagnetic waves equivalent to sunlight, the foregoing sensitizing dye carried by a semiconductor is excited by absorbing exposure light or electromagnetic waves.

Electrons are generated via excitation are moved to the semiconductor; subsequently moved to the second electrode via a conductive support and an external load; and supplied into a hole transport material constituting a hole transport layer.

On the other hand, a sensitizing dye with which electrons are moved to the semiconductor becomes an oxidant, but electrons are supplied from the second electrode via polymer A contained in the hole transport layer to conduct reducing, whereby they are returned to the original state via reduction thereof. At the same time, a polymer contained in the hole transport layer is oxidized to return to a state capable of being reduced again by electrons supplied from the second electrode.

Electrons are moved in such a manner, and a solar cell fitted with a photoelectric conversion element of the present invention can be designed to be provided.

EXAMPLE

The present invention will be described referring to Examples, but the present invention is not limited thereto.

Example

Preparation of Photoelectric Conversion Element SC-1 (Present Invention)

A fluorine-doped tin oxide (FTO) conductive glass substrate having a sheet resistance of 20Ω/□ was prepared as the first electrode. A solution in which 1.2 ml of tetrakisisopropoxy titanium and 0.8 ml of acetylacetone were diluted in 18 ml of ethanol was dropped onto the resulting substrate to prepare a film via a coating method, followed by heating at 450° C., and a barrier layer composed of a titanium oxide thin film having a thickness of 30-50 nm was subsequently formed on the transparent conductive film (FTO).

Titanium oxide paste {anatase type, a primary average particle diameter (microscopic observation average) of 18 nm, and ethylene cellulose dispersed in 10% by weight of acetone water} was coated onto an FTO glass substrate on which the above-described barrier layer was formed by a screen printing method (a coating area of 25 mm$^2$). Calcination was carried out at 200° C. for 10 minutes, and at 500° C. for 15 minutes to obtain a titanium oxide thin film having a thickness of 2.5 μm. Sensitizing dye D-38 was dissolved in a mixed solvent of acetonitrile: t-butylalcohol=1:1 to prepare a $5 \times 10^{-4}$ mol/l solution. An FTO glass substrate obtained via coating and calcination of the above-described titanium oxide was subjected to a dye adsorption treatment via immersion in the foregoing solvent at room temperature for 3 hours, and a photoelectric conversion layer was formed to obtain a semiconductor electrode.

The foregoing semiconductor electrode was immersed in an acetonitrile solution (an electropolymerization solution) containing $1 \times 10^{-3}$ (mol/l) of a dimer of an isothianaphthene based monomer M1-1 under the condition of argon atmosphere, and further containing 0.1 (mol/l) of Li [(CF$_3$SO$_2$)$_2$N]. The foregoing semiconductor electrode was used as an acting electrode; a platinum wire was used as a counter electrode; Ag/Ag$^+$ (AgNO$_3$ 0.01M) was used as a reference electrode; and a holding voltage was set to −0.16 V. The voltage was maintained for 30 minutes while exposing the resulting to light from the semiconductor layer (use of a xenon lamp, a light intensity of 22 mW/cm$^2$, and cutting off of a wavelength of 430 mm or less) to form a hole transport layer on the foregoing semiconductor electrode surface. The resulting semiconductor electrode/hole transport layer was washed with acetonitrile, followed by drying.

In addition, the hole transport layer obtained here has become a polymerization film insoluble in a solvent.

Subsequently, the resulting semiconductor electrode/hole transport layer was immersed in an acetonitrile solution containing $15 \times 10^{-3}$ (mol/l) of Li[(CF$_3$SO$_2$)$_2$N], and further containing $50 \times 10^{-3}$ (mol/l) of tert-butylpridine.

Then, the semiconductor electrode/hole transport layer was naturally dried; gold was subsequently evaporated until reaching a thickness of 60 nm by a vacuum evaporation method; and the second electrode was prepared to obtain photoelectric conversion element SC-1.

Further, samples for visible light transmittance evaluation of the polymer having a repeating unit of Formula (1) or Formula (2) were separately prepared by the following method. An FTO conductive glass substrate as an acting electrode was immersed in a solution having the same composition as that of the foregoing electropolymerization solution; a platinum wire was used as the counter electrode; Ag/Ag$^+$ (AgNO$_3$ 0.01M) was used as the reference electrode; and the holding voltage was set to +0.60 V to form a polymer having a repeating unit of Formula (1) or Formula (2) on the FTO conductive glass substrate by making current to run in a dark place until reaching an aggregate charge amount of 25 mC.

[Preparation of Photoelectric Conversion Elements SC-2-SC-25 (Present Invention)]

Photoelectric conversion elements SC-2-SC 25 were prepared similarly to preparation of photoelectric conversion element 1, except that each of sensitizing dyes shown in FIG. 1 was used so as to employ sensitizing dye D-38 in the preparation of photoelectric conversion element 1; and as to an electropolymerization solution for preparation of a hole transport layer {a layer formed of a polymer having a repeating unit of Formula (1) or Formula (2)}, isothianaphthene based monomer: M1-1 was replaced by each of compounds shown in Table.

[Preparation of Photoelectric Conversion Elements SC-26-SC-30 (Comparative Example)]

Photoelectric conversion elements SC-26-SC-30 were prepared similarly to preparation of photoelectric conversion element 1, except that as to an electropolymerization solution, M1-1 was replaced by each of the following monomers shown in Table 1.

In addition, with respect to all the monomers in addition to those in Comparative examples, a polymer was synthesized employing a dimer.

Further, M-R1, M-R2, M-R3, M-R4 and M-R5 in Table 1 represent the following monomers.

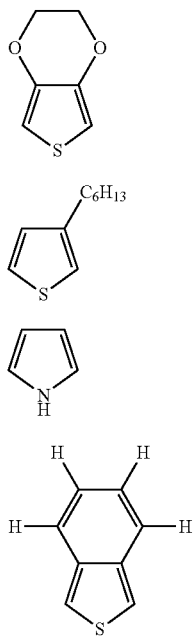

M-R1

M-R2

M-R3

M-R4

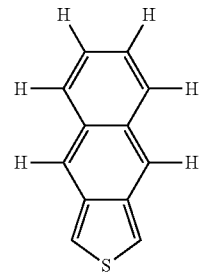

M-R5

[Evaluation of Photoelectric Conversion Element]

The resulting photoelectric conversion element was evaluated by exposing it to pseudo-sunlight at 100 mW/cm² from a xenon lamp through AM filter (AM-1.5), employing a solar simulator (manufactured by EKO Instruments Co., Ltd.).

That is, as to the photoelectric conversion element, a current-voltage characteristic was measured with an I-V tester at room temperature, and short-circuit current (Jsc), open voltage (Voc) and form factor (F.F.) were determined to obtain photoelectric conversion efficiency {η (%)} from these values. In addition, conversion efficiency of the photoelectric conversion element {η (%)} was calculated based on the following equation (A).

$$\eta = 100 \times (Voc \times Jsc \times F.F.)/P \quad (A),$$

where P represents incident light intensity [mW/cm⁻²]; Voc represents open voltage [V]; Jsc represents short-circuit current density [mA·cm⁻²]; F.F. represents a form factor.

(Measurement of Photoelectric Conversion Efficiency after Light Degradation Test)

After exposing it to xenon lamp light having an intensity of 100 mW/cm⁻² in an open circuit, photoelectric conversion efficiency {$\eta_1$(%)} was determined to calculate a ratio with respect to an initial photoelectric conversion efficiency.

(Evaluation of Light Absorption of Hole Transport Material)

Light absorbance of a film formed of polymer A prepared on an FTO conductive glass substrate was measured by the foregoing method employing a spectrophotometer (JASCO V-530), and a difference between the foregoing light absorbance and light absorbance of only the FTO conductive glass substrate is taken to draw light absorbance of only a polymer. The mean value of light absorbance in the wavelength range between 400 and 700 nm is used as a target for comparison of light absorption of a hole transport material. Since film thickness of the polymer varied from 0.15 μm to 0.30 μm, depending on different compounds, a value divided by average film thickness (μm) [light absorbance per μm] was used for comparison of light absorbance.

Characteristic evaluation results of each photoelectric conversion element are shown in Table 1.

TABLE 1

| *1 | *2 | *3 | Initial characteristics | | | | Characteristics after photodegradation | | | | Durability | *4 | *5 |
|---|---|---|---|---|---|---|---|---|---|---|---|---|---|
| | | | Voc | Jsc | F.F. | η | Voc1 | Jsc1 | F.F.1 | $\eta_1$ | $\eta_1/\eta$ | | |
| SC-1 | D-38 | M1-1 | 802 | 6.6 | 0.69 | 3.7 | 753 | 6.4 | 0.55 | 2.7 | 0.73 | 0.39 | Ex. 1 |
| SC-2 | D-38 | M1-2 | 809 | 7.6 | 0.69 | 4.2 | 765 | 7.5 | 0.60 | 3.4 | 0.81 | 0.29 | Ex. 2 |
| SC-3 | D-39 | M1-3 | 821 | 7.7 | 0.70 | 4.4 | 795 | 7.7 | 0.60 | 3.7 | 0.83 | 0.32 | Ex. 3 |
| SC-4 | D-41 | M1-4 | 830 | 6.5 | 0.69 | 3.7 | 815 | 6.3 | 0.54 | 2.8 | 0.74 | 0.41 | Ex. 4 |
| SC-5 | D-42 | M1-5 | 799 | 6.4 | 0.72 | 3.7 | 760 | 6.3 | 0.55 | 2.6 | 0.72 | 0.38 | Ex. 5 |
| SC-6 | D-40 | M1-6 | 811 | 7.6 | 0.71 | 4.4 | 785 | 7.4 | 0.64 | 3.7 | 0.85 | 0.31 | Ex. 6 |

TABLE 1-continued

| *1 | *2 | *3 | Initial characteristics | | | | Characteristics after photodegradation | | | | Durability | | *4 | *5 |
|---|---|---|---|---|---|---|---|---|---|---|---|---|---|---|
| | | | Voc | Jsc | F.F. | $\eta$ | Voc1 | Jsc1 | F.F.1 | $\eta_1$ | $\eta_1/\eta$ | | | |
| SC-7 | D-44 | M1-7 | 829 | 7.4 | 0.68 | 4.2 | 815 | 7.2 | 0.63 | 3.7 | 0.89 | | 0.29 | Ex. 7 |
| SC-8 | D-43 | M1-8 | 841 | 6.6 | 0.67 | 3.7 | 835 | 6.4 | 0.52 | 2.8 | 0.75 | | 0.36 | Ex. 8 |
| SC-9 | D-38 | M1-9 | 862 | 7.2 | 0.65 | 4.0 | 825 | 7.0 | 0.59 | 3.4 | 0.84 | | 0.32 | Ex. 9 |
| SC-10 | D-22 | M2-1 | 741 | 7.9 | 0.68 | 4.0 | 619 | 7.2 | 0.43 | 1.9 | 0.48 | | 0.23 | Ex. 10 |
| SC-11 | D-38 | M2-2 | 748 | 8.9 | 0.68 | 4.5 | 640 | 8.4 | 0.48 | 2.6 | 0.57 | | 0.19 | Ex. 11 |
| SC-12 | D-38 | M2-3 | 750 | 7.7 | 0.70 | 4.0 | 655 | 7.1 | 0.39 | 1.8 | 0.45 | | 0.24 | Ex. 12 |
| SC-13 | D-38 | M2-4 | 759 | 8.5 | 0.70 | 4.5 | 697 | 8.0 | 0.49 | 2.7 | 0.61 | | 0.18 | Ex. 13 |
| SC-14 | D-39 | M2-5 | 775 | 8.4 | 0.69 | 4.5 | 715 | 7.9 | 0.49 | 2.8 | 0.62 | | 0.24 | Ex. 14 |
| SC-15 | D-41 | M2-6 | 785 | 7.9 | 0.68 | 4.2 | 730 | 7.1 | 0.38 | 2.0 | 0.47 | | 0.23 | Ex. 15 |
| SC-16 | D-12 | M2-7 | 736 | 8.0 | 0.67 | 3.9 | 610 | 7.6 | 0.42 | 1.9 | 0.49 | | 0.26 | Ex. 16 |
| SC-17 | D-40 | M2-8 | 748 | 8.7 | 0.68 | 4.4 | 652 | 8.1 | 0.48 | 2.5 | 0.57 | | 0.18 | Ex. 17 |
| SC-18 | D-42 | M2-9 | 739 | 8.2 | 0.70 | 4.2 | 615 | 7.5 | 0.40 | 1.8 | 0.43 | | 0.23 | Ex. 18 |
| SC-19 | D-38 | M2-10 | 752 | 8.6 | 0.71 | 4.6 | 700 | 8.3 | 0.49 | 2.8 | 0.62 | | 0.17 | Ex. 19 |
| SC-20 | D-44 | M2-11 | 785 | 8.5 | 0.73 | 4.9 | 740 | 8.2 | 0.50 | 3.0 | 0.62 | | 0.25 | Ex. 20 |
| SC-21 | D-43 | M2-12 | 790 | 8.1 | 0.72 | 4.6 | 745 | 7.4 | 0.41 | 2.3 | 0.49 | | 0.24 | Ex. 21 |
| SC-22 | D-35 | M1-5 | 803 | 6.6 | 0.72 | 3.8 | 765 | 6.6 | 0.55 | 2.8 | 0.73 | | 0.41 | Ex. 22 |
| SC-23 | D-35 | M1-6 | 812 | 7.9 | 0.71 | 4.6 | 788 | 7.8 | 0.59 | 3.6 | 0.80 | | 0.31 | Ex. 23 |
| SC-24 | D-35 | M1-7 | 831 | 7.8 | 0.68 | 4.4 | 817 | 7.7 | 0.61 | 3.8 | 0.87 | | 0.29 | Ex. 24 |
| SC-25 | D-35 | M1-8 | 839 | 6.9 | 0.67 | 3.9 | 833 | 6.6 | 0.50 | 2.7 | 0.71 | | 0.38 | Ex. 25 |
| SC-26 | D-38 | M-R4 | 789 | 7.7 | 0.68 | 4.1 | 710 | 6.3 | 0.40 | 1.8 | 0.43 | | 0.30 | Comp. 1 |
| SC-27 | D-38 | M-R5 | 715 | 8.5 | 0.67 | 4.1 | 530 | 7.2 | 0.29 | 1.1 | 0.27 | | 0.18 | Comp. 2 |
| SC-28 | D-38 | M-R1 | 820 | 4.7 | 0.70 | 2.7 | 780 | 4.5 | 0.49 | 1.7 | 0.64 | | 1.27 | Comp. 3 |
| SC-29 | D-38 | M-R2 | 854 | 1.3 | 0.52 | 0.6 | 390 | 1.0 | 0.33 | 0.1 | 0.22 | | 3.55 | Comp. 4 |
| SC-30 | D-38 | M-R3 | 810 | 1.1 | 0.60 | 0.5 | 350 | 0.5 | 0.40 | 0.1 | 0.13 | | 4.60 | Comp. 5 |

*1: Photoelectric conversion element No.
*2: Sensitizing dye
*3: A monomer corresponding to a repeating unit of Formula (1) or Formula (2)
*4: Light absorbance (1/μm) of a polymer having a repeating unit of Formula (1) or Formula (2)
*5: Remarks
Ex.: Example
Comp.: Comparative example As is clear from Table 1, each of photoelectric conversion elements (from SC-1 to SC 25) of the present invention possessing a hole transport layer containing a polymer of the present invention exhibits small light absorbance, photoelectric conversion efficiency and excellent stability thereof of a polymer having a repeating unit of Formula (1) or Formula (2). Further, when at least one of $R_2$ and $R_3$ in Formula (1) is a halogen atom or a CN group, and the remaining substituents are hydrogen atoms; or at least one of $R_{22}$, $R_{23}$, $R_{24}$ and $R_{25}$ in Formula (2) is a halogen atom or a CN group, and the remaining substituents are hydrogen atoms, doping stability becomes high, whereby among data of photoelectric conversion elements (from SC-1 to SC-25) of the present invention, the photoelectric conversion efficiency and a matter property thereof in stability are excellent. On the other hand, photoelectric conversion elements SC-26 and SC-27 of Comparative examples exhibit large degradation in photoelectric conversion efficiency after conducting a light degradation test, resulting in appearance of a remaining problem such as durability, and in the case of photoelectric conversion elements SC-28, SC-29 and SC-30 of Comparative examples, the foregoing light absorbance is large; photoelectric conversion efficiency is low; and stability thereof is also poor.

EFFECT OF THE INVENTION

The present invention can provide an all-solid-state dye-sensitizing type photoelectric conversion element exhibiting excellent photoelectric conversion efficiency and excellent stability in photoelectric conversion function, and a solar cell thereof.

What is claimed is:
1. A photoelectric conversion element comprising a substrate and provided thereon, a first electrode, a photoelectric conversion layer comprising a semiconductor and a sensitizing dye, a hole transport layer and a second electrode, wherein the hole transport layer comprises a polymer comprising a repeating unit represented by Formula (1) or Formula (2):

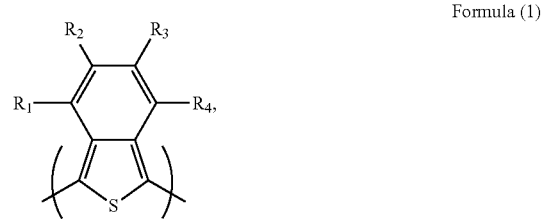

Formula (1)

where at least one of $R_1$, $R_2$, $R_3$ and $R_4$ is a halogen atom or a CN group, and each of those substituents other than the at least one is a hydrogen atom; and

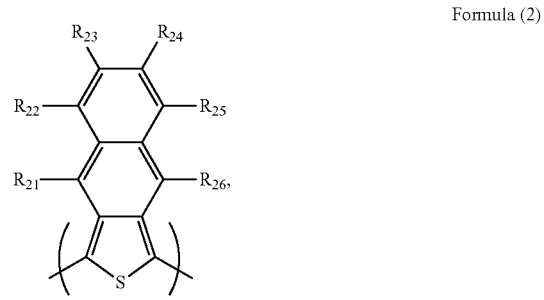

Formula (2)

where at least one of $R_{21}$, $R_{22}$, $R_{23}$, $R_{24}$, $R_{25}$ and $R_{26}$ is a halogen atom or a CN group, and each of those substituents other than the at least one is a hydrogen atom.

2. The photoelectric conversion element of claim 1, wherein at least one of $R_2$ and $R_3$ in Formula (1) is a halogen atom or a CN group and each of those substituents other than the at least one is a hydrogen atom, or at least one of $R_{22}$, $R_{23}$, $R_{24}$ and $R_{25}$ in Formula (2) is a halogen atom or a CN group and each of those substituents other than the at least one is a hydrogen atom.

3. The photoelectric conversion element of claim 1, wherein the polymer comprises a polymer polymerized on the photoelectric conversion layer.

4. The photoelectric conversion element of claim 1, wherein the semiconductor comprises titanium oxide.

5. The photoelectric conversion element of claim 1, wherein the sensitizing dye comprises a partial structure represented by Formula (3):

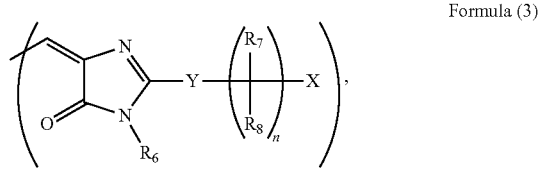

Formula (3)

where $R_6$ represents a hydrogen atom, a substituted or unsubstituted alkyl group, a substituted or unsubstituted alkenyl group, a substituted or unsubstituted alkynyl group, a substituted or unsubstituted aryl group, a substituted or unsubstituted amino group, a substituted or unsubstituted cyano group, or a substituted or unsubstituted heterocyclic group; Y represents a sulfur atom, an oxygen atom or a selenium atom; $R_7$ and $R_8$ each represent a hydrogen atom, a halogen atom, a hydroxyl group, a thiol group, a cyano group, a substituted or unsubstituted alkyl group, a substituted or unsubstituted aryl group, a substituted or unsubstituted alkenyl group, a substituted or unsubstituted alkynyl group, a substituted or unsubstituted alkoxy group, a substituted or unsubstituted amino group, or a substituted or unsubstituted heterocyclic group, and may be connected to each other to form a ring; n is an integer of 0 or more; when n≥2, $R_7$ and $R_8$ may be identical to each other or be different from each other; X represents an acidic group; and when including a carbon-carbon double bond in Formula (3), the carbon-carbon double bond may be in any of a cis arrangement and a trans arrangement.

6. A method of manufacturing a photoelectric conversion element comprising a substrate and provided thereon, a first electrode, a photoelectric conversion layer comprising a semiconductor and a sensitizing dye, a hole transport layer and a second electrode, comprising the step of:
forming the hole transport layer via electropolymerization employing a monomer or a polymer thereof represented by Formula (1') or Formula (2'):

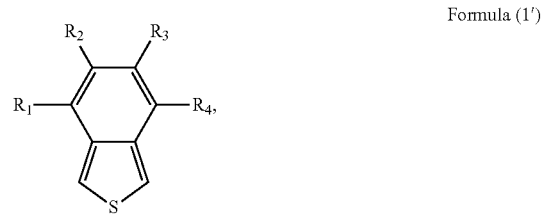

Formula (1')

where at least one of $R_1$, $R_2$, $R_3$ and $R_4$ is a halogen atom or a CN group, and each of those substituents other than the at least one is a hydrogen atom; and

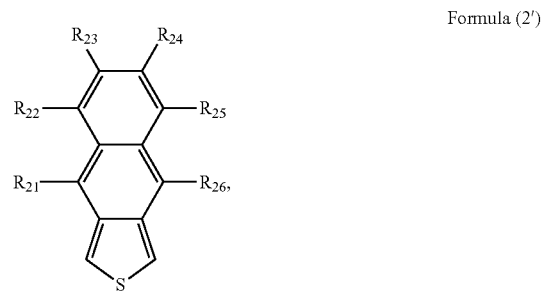

Formula (2')

where at least one of $R_{21}$, $R_{22}$, $R_{23}$, $R_{24}$, $R_{25}$ and $R_{26}$ is a halogen atom or a CN group, and each of those substituents other than the at least one is a hydrogen atom.

7. The photoelectric conversion element of claim 6, wherein at least one of $R_2$ and $R_3$ in Formula (1') is a halogen atom or a CN group and each of those substituents other than the at least one is a hydrogen atom, or at least one of $R_{22}$, $R_{23}$, $R_{24}$ and $R_{25}$ in Formula (2') is a halogen atom or a CN group and each of those substituents other than the at least one is a hydrogen atom.

8. A solar cell comprising the photoelectric conversion element of claim 1.

* * * * *

UNITED STATES PATENT AND TRADEMARK OFFICE
CERTIFICATE OF CORRECTION

| | | |
|---|---|---|
| PATENT NO. | : 8,642,720 B2 | Page 1 of 1 |
| APPLICATION NO. | : 13/229334 | |
| DATED | : February 4, 2014 | |
| INVENTOR(S) | : Kenichi Onaka et al. | |

It is certified that error appears in the above-identified patent and that said Letters Patent is hereby corrected as shown below:

On the Title Page at item (75), third Inventor's name, "Kazukumi Nishimura" should read --Kazukuni Nishimura--

Signed and Sealed this
Eighth Day of July, 2014

Michelle K. Lee
*Deputy Director of the United States Patent and Trademark Office*